(12) United States Patent
Lee

(10) Patent No.: US 9,859,293 B2
(45) Date of Patent: Jan. 2, 2018

(54) SEMICONDUCTOR DEVICE AND MANUFACTURING METHOD THEREOF

(71) Applicant: SK hynix Inc., Icheon-si, Gyeonggi-do (KR)

(72) Inventor: Nam Jae Lee, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/288,078

(22) Filed: Oct. 7, 2016

(65) Prior Publication Data

US 2017/0352673 A1 Dec. 7, 2017

(30) Foreign Application Priority Data

Jun. 1, 2016 (KR) .................. 10-2016-0068350

(51) Int. Cl.
*H01L 27/115* (2017.01)
*H01L 23/528* (2006.01)
*H01L 21/28* (2006.01)
*H01L 27/11565* (2017.01)
*H01L 27/1157* (2017.01)
*H01L 27/11582* (2017.01)
*H01L 27/11573* (2017.01)
*H01L 23/522* (2006.01)

(52) U.S. Cl.
CPC ...... *H01L 27/11565* (2013.01); *H01L 23/528* (2013.01); *H01L 23/5226* (2013.01); *H01L 27/1157* (2013.01); *H01L 27/11573* (2013.01); *H01L 27/11582* (2013.01)

(58) Field of Classification Search
CPC ........... H01L 27/11565; H01L 27/1157; H01L 27/11573; H01L 27/11582; H01L 23/528; H01L 23/5226
USPC ........ 257/314, 324, 326, 329, 774, E21.645, 257/E27.06; 438/268, 424, 486
See application file for complete search history.

(56) References Cited

U.S. PATENT DOCUMENTS

| | | | |
|---|---|---|---|
| 2015/0004777 A1* | 1/2015 | Kohji | H01L 21/28282 438/486 |
| 2015/0340376 A1* | 11/2015 | Park | H01L 27/11582 257/329 |
| 2016/0260735 A1* | 9/2016 | Lee | H01L 27/11582 |
| 2016/0268263 A1* | 9/2016 | Lee | H01L 27/2481 |

FOREIGN PATENT DOCUMENTS

| | | |
|---|---|---|
| KR | 1020150138934 A | 12/2015 |
| KR | 1020160018921 A | 2/2016 |

* cited by examiner

*Primary Examiner* — Dao H Nguyen
(74) *Attorney, Agent, or Firm* — William Park & Associates Ltd.

(57) ABSTRACT

A semiconductor device includes a second channel layer in a first column and a second channel layer in a second column disposed biased to one side of a first channel layer in a first column and a first channel layer in a second column, respectively. The one side of the first channel layer in the first column and the one side of the first channel layer in the second column face directions opposite to each other.

13 Claims, 22 Drawing Sheets

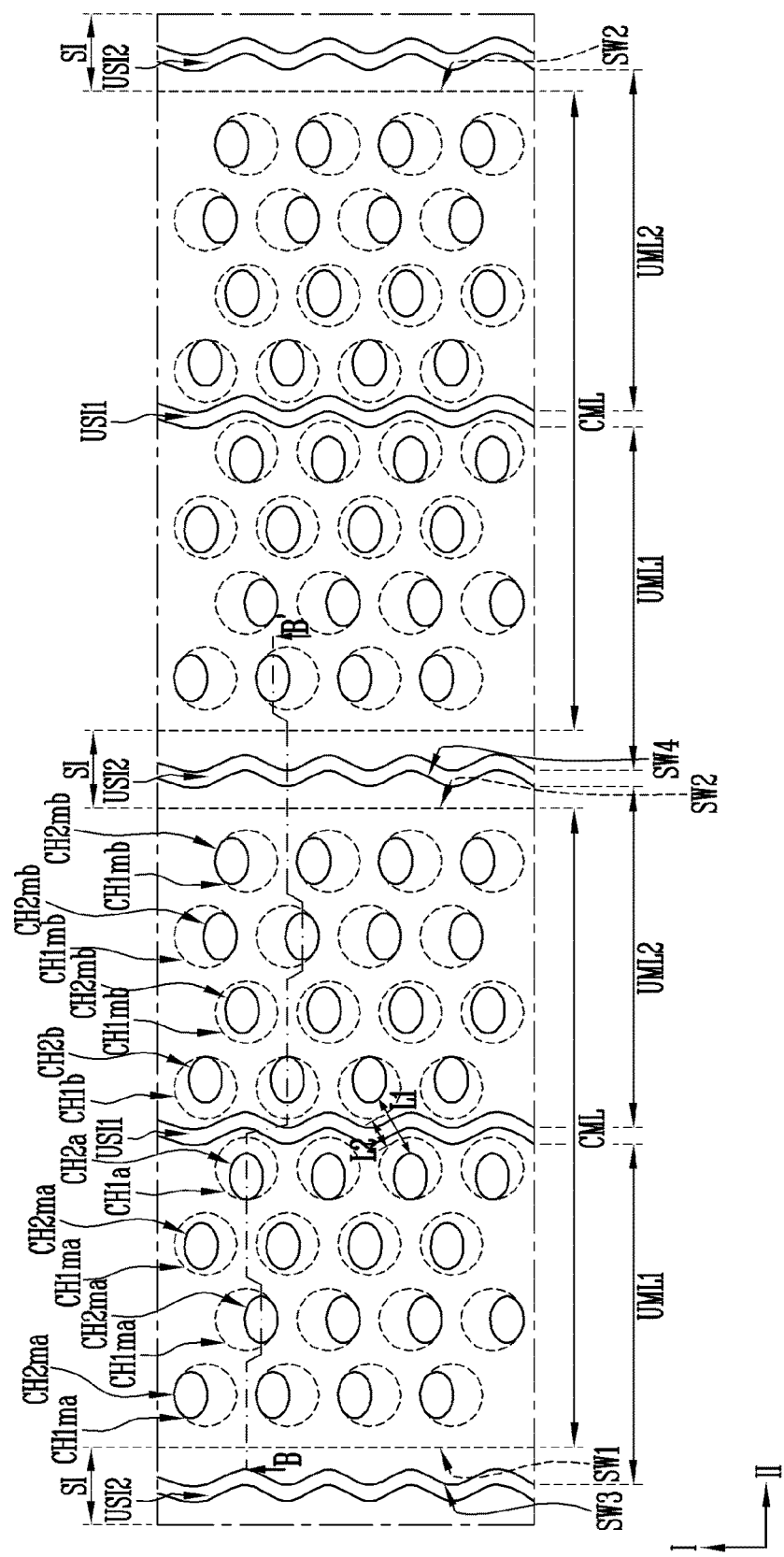

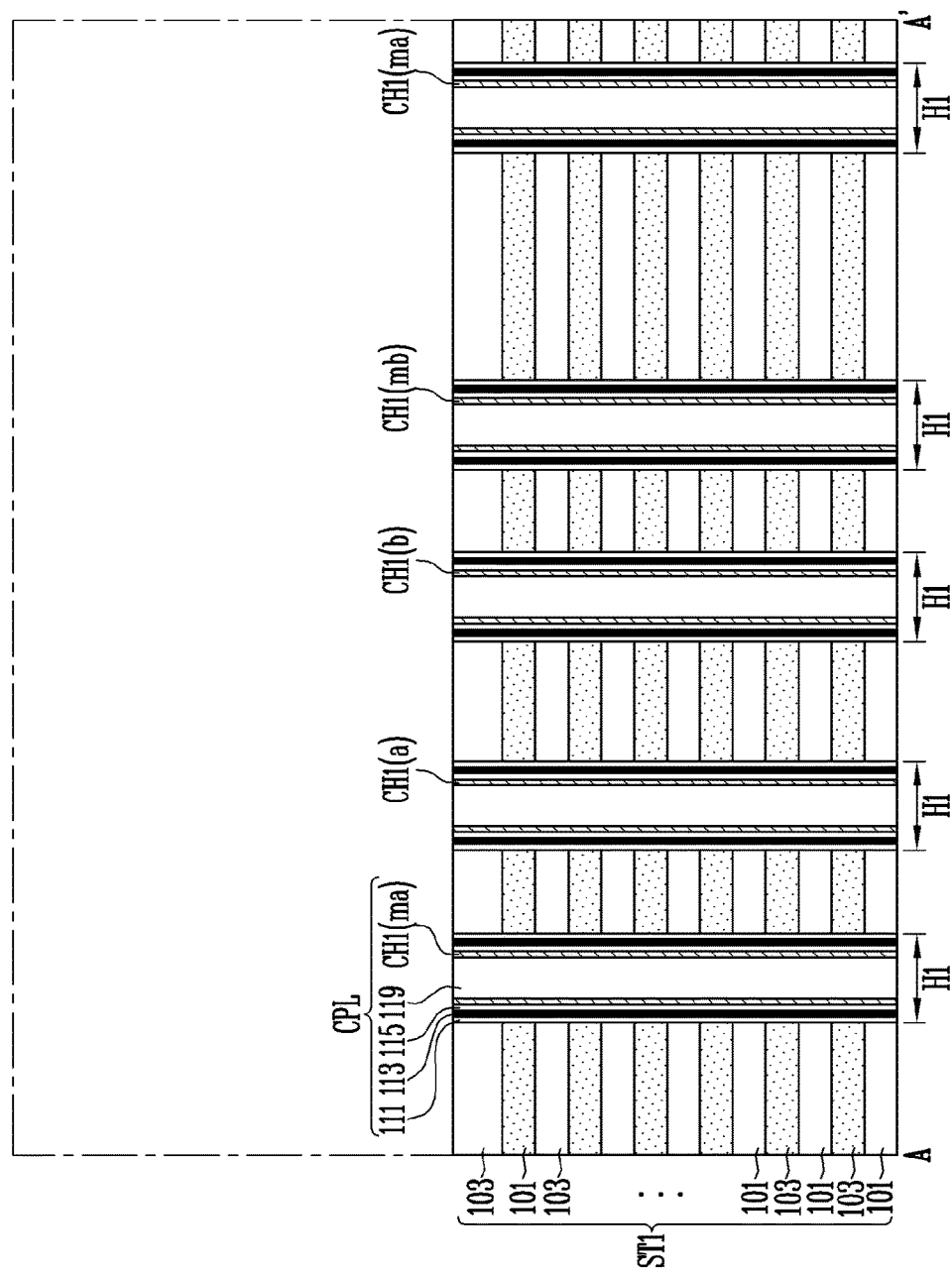

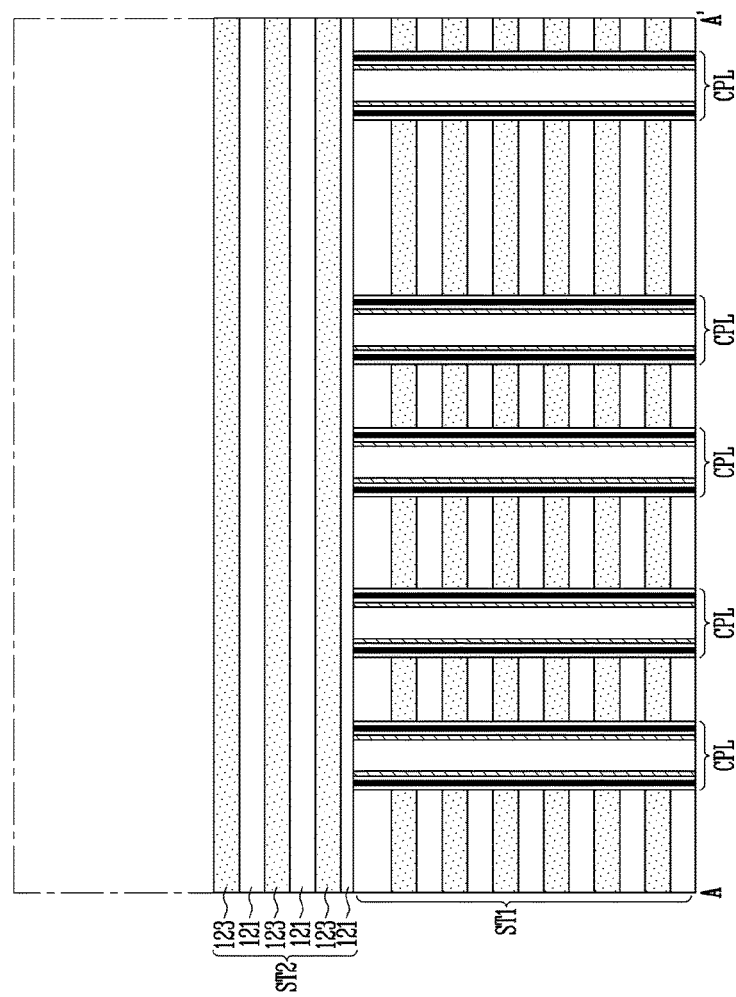

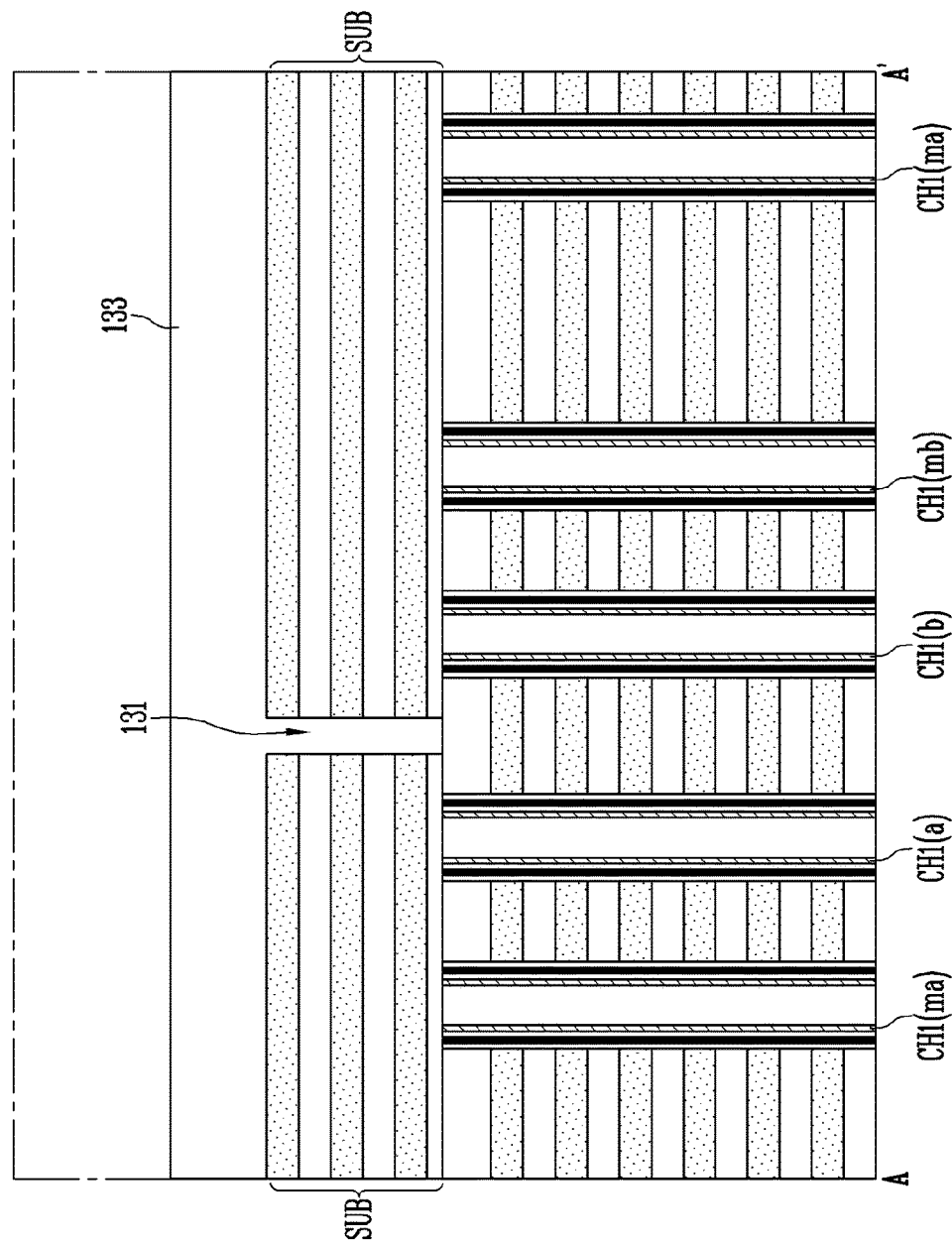

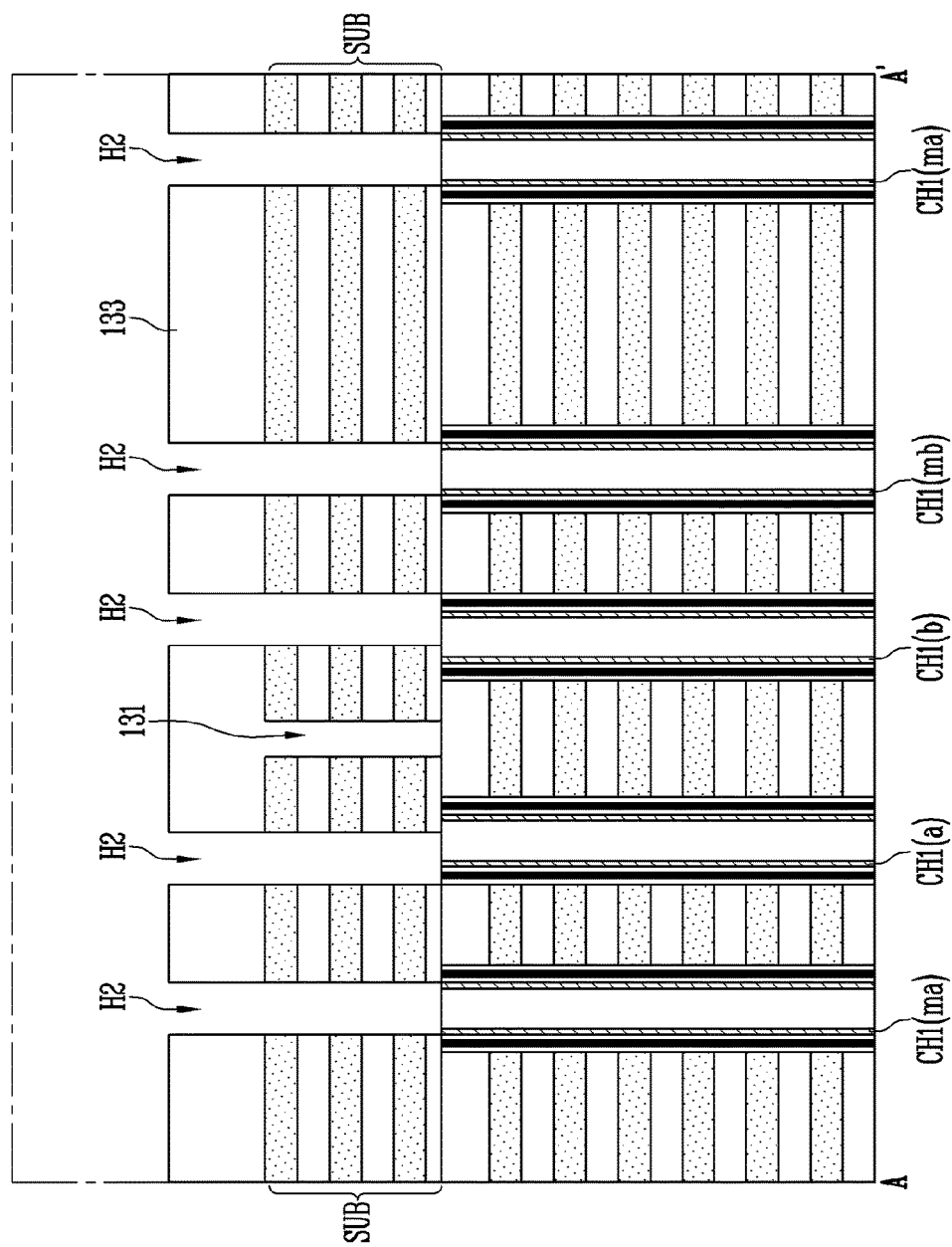

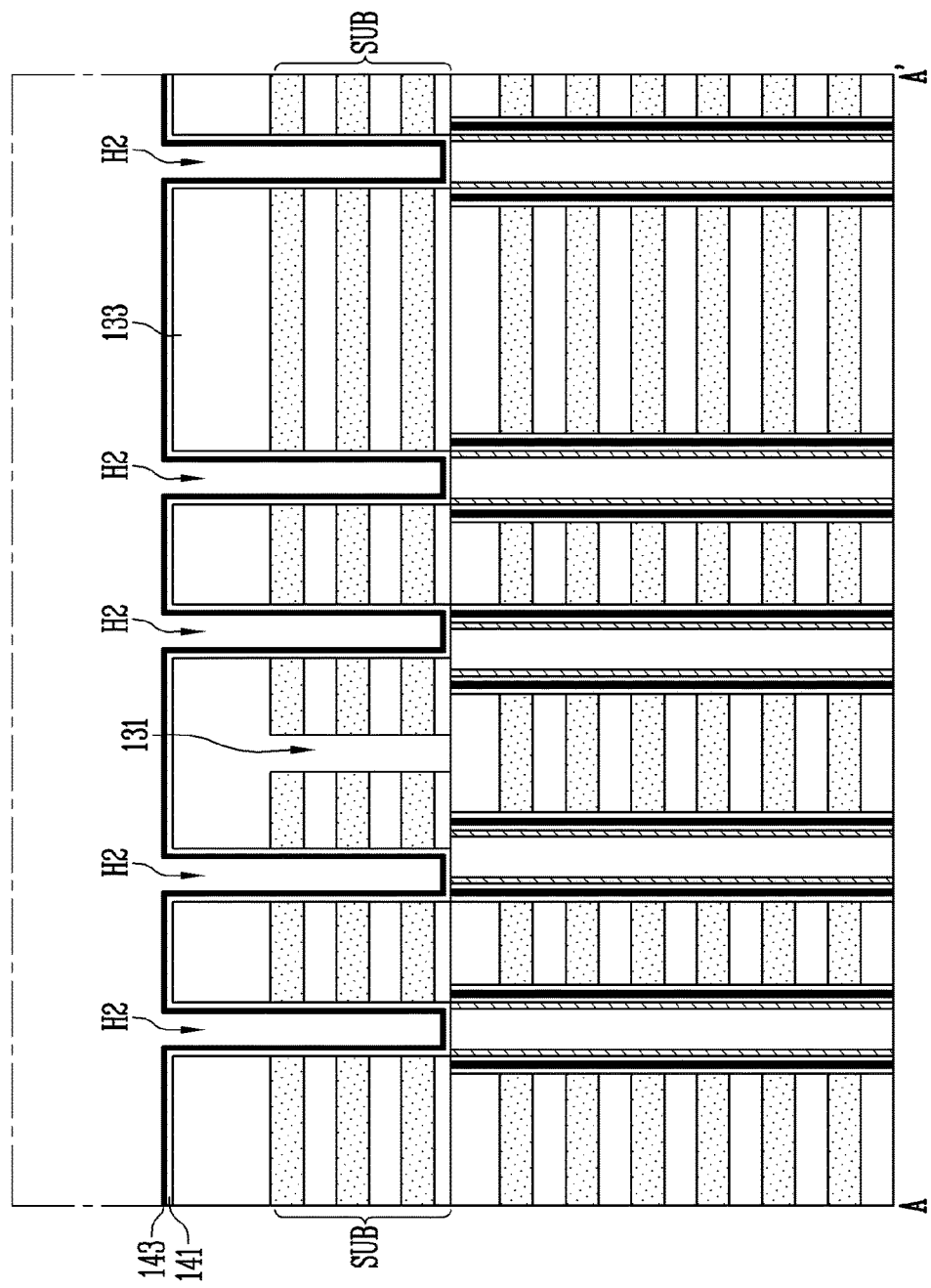

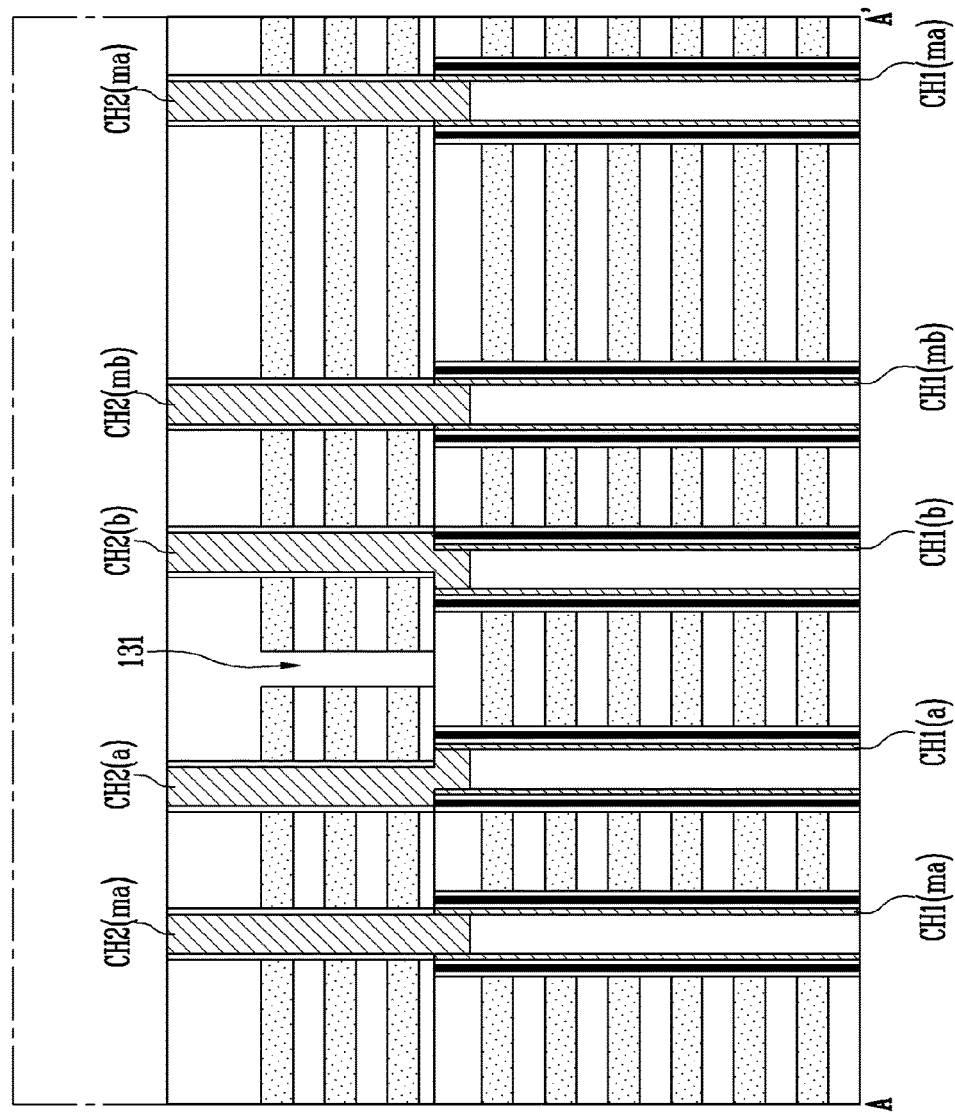

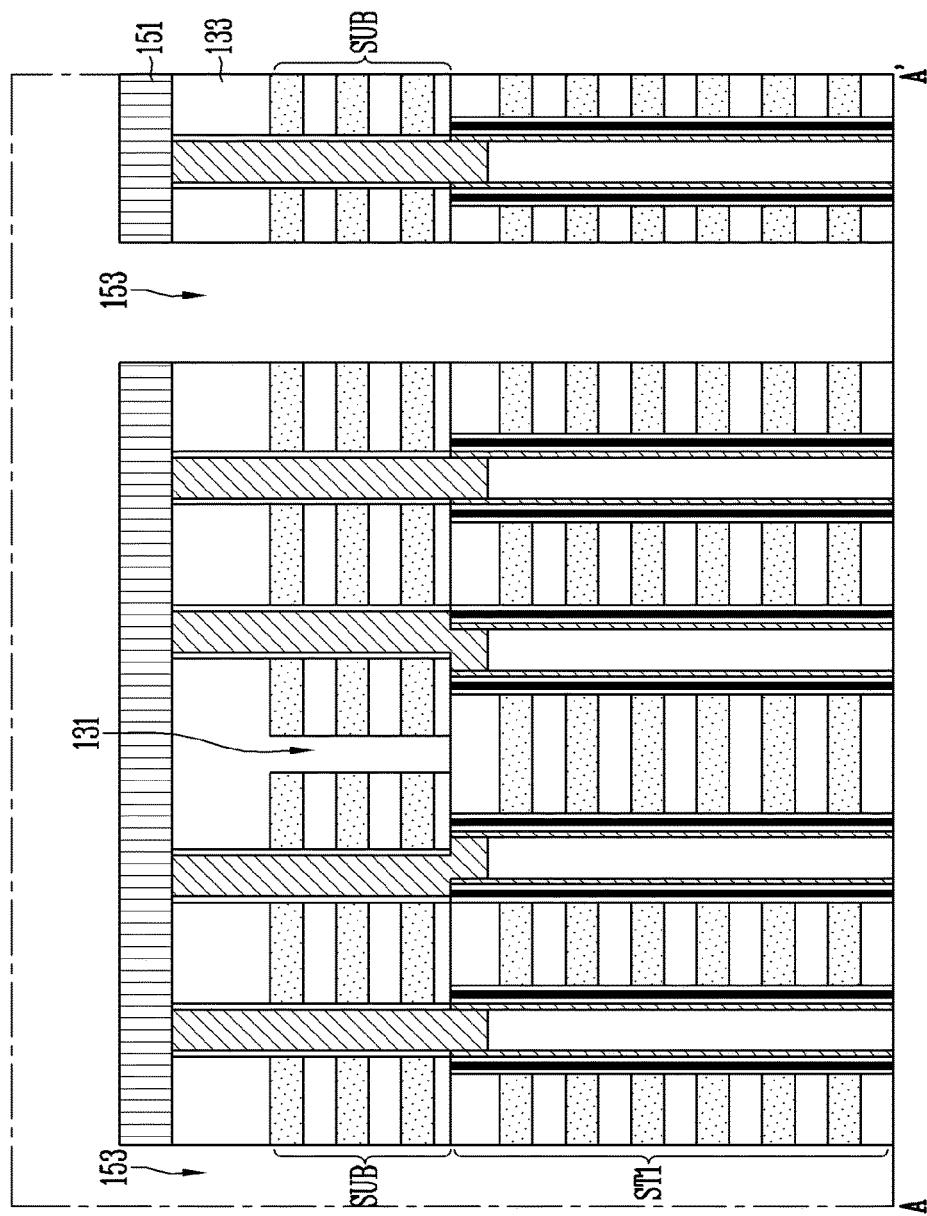

SEMICONDUCTOR DEVICE AND MANUFACTURING METHOD THEREOF

CROSS-REFERENCE TO RELATED APPLICATION

The present application claims priority under 35 U.S.C. §119(a) to Korean patent application number 10-2016-0068350 filed on Jun. 1, 2016 in the Korean Intellectual Property Office, the entire disclosure of which is incorporated herein by reference.

BACKGROUND

1. Technical Field

An aspect of the present disclosure relates to a semiconductor device and a manufacturing method thereof, and more particularly, to a semiconductor device including a three-dimensional memory cell array and a manufacturing method thereof.

2. Description of the Related Art

A semiconductor device may include a memory cell array including a plurality of memory cells. The memory cell array may include memory cells arranged in various structures. In order to improve the degree of integration of semiconductor devices, the memory cells may be arranged three-dimensionally on a substrate.

SUMMARY

According to an aspect of the present disclosure, there is provided a semiconductor device including: a cell stack structure extending along an extending direction of a first axis, the cell stack structure having a first sidewall and a second sidewall, which respectively face in both directions of a second axis intersecting the first axis; first channel layers in a first column and a second column, which penetrate the cell stack structure; first and second upper stack structures isolated from each other by a first upper slit extending along a boundary between the first channel layers in the first column and the first channel layers in the second column, the first and second upper stack structures disposed on the cell stack structure; second channel layers in a first column, penetrating the first upper stack structure, the second channel layers in the first column, overlapping the first channel layers in the first column to be biased to one side of the first channel layers in the first column, which face the first sidewall; and second channel layers in a second column, penetrating the second upper stack structure, the second channel layers in the second column overlapping the first channel layers in the second column to be biased to one side of the first channel layers in the second column, which face the second sidewall.

According to an aspect of the present disclosure, there is provided a method of manufacturing a semiconductor device, the method including: forming first channel layers in a first column and a second column, which penetrate a first stack structure; forming a second stack structure on the first stack structure to cover the first channel layers in the first and second columns; forming a first upper slit isolating the second stack structure into sub-stack structures by penetrating the second stack structure along a boundary between the first channel layers in the first column and the first channel layers in the second column; and forming second channel layers in a first column and a second column, which penetrate the sub-stack structures, wherein the second channel layers in the first column and the second channel layers in the second column overlap with the first channel layers in the first column and the first channel layers in the second column to be biased to one side of the first channel layers in the first column and one side of the first channel layers in the second columns, which face in both directions of an axis intersecting the first upper slit, respectively.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey a scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 6A and 6B are plan and sectional views of a semiconductor device according to an embodiment of the present disclosure.

FIGS. 7A to 7I are sectional views illustrating a manufacturing method of a semiconductor device according to an embodiment of the present disclosure.

DETAILED DESCRIPTION

Hereinafter, exemplary embodiments of the present disclosure will be described in detail with reference to the accompanying drawings. However, the present disclosure is not limited to the embodiments but may be implemented in different forms. These embodiments are provided only for illustrative purposes and for full understanding of the scope of the present disclosure by those skilled in the art. Further, the scope of the present disclosure should be understood within the scope of the present disclosure defined by the appended claims.

Embodiments provide a semiconductor device and a manufacturing method thereof, which can improve the degree of integration.

Figure 1:
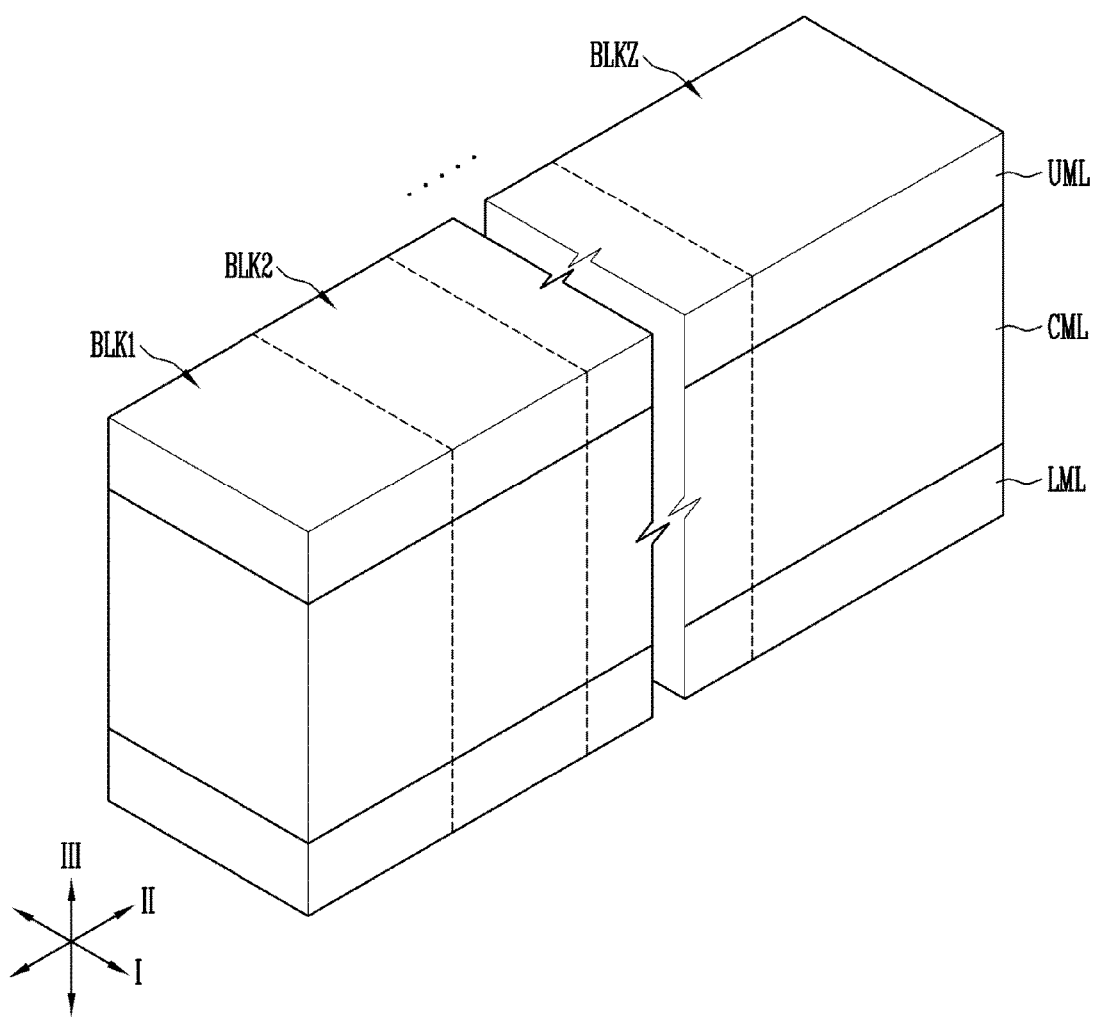
FIG. 1 is a block diagram of a semiconductor device according to an embodiment of the present disclosure.

FIG. 1 is a block diagram of a semiconductor device according to an embodiment of the present disclosure.

Referring to FIG. 1, the semiconductor device according to an embodiment of the present disclosure includes a memory cell array divided into a plurality of memory blocks BLK1 to BLKZ. Each of the memory blocks BLK1 to BLKZ includes memory cells three-dimensionally arranged along extending directions of a first axis I, a second axis II, and a third axis III. Each of the memory blocks BLK1 to BLKZ may include a lower stack structure LML, a cell stack structure CML stacked on the lower stack structure LML, and an upper stack structure UML stacked on the cell stack structure CML. Each of the lower stack structure LML, the cell stack structure CML, and the upper stack structure UML may be formed into a multi-layered structure including two or more layers. A structure of each of the memory blocks BLK1 to BLKZ will be described later in detail with reference to FIG. 2.

Figure 2:
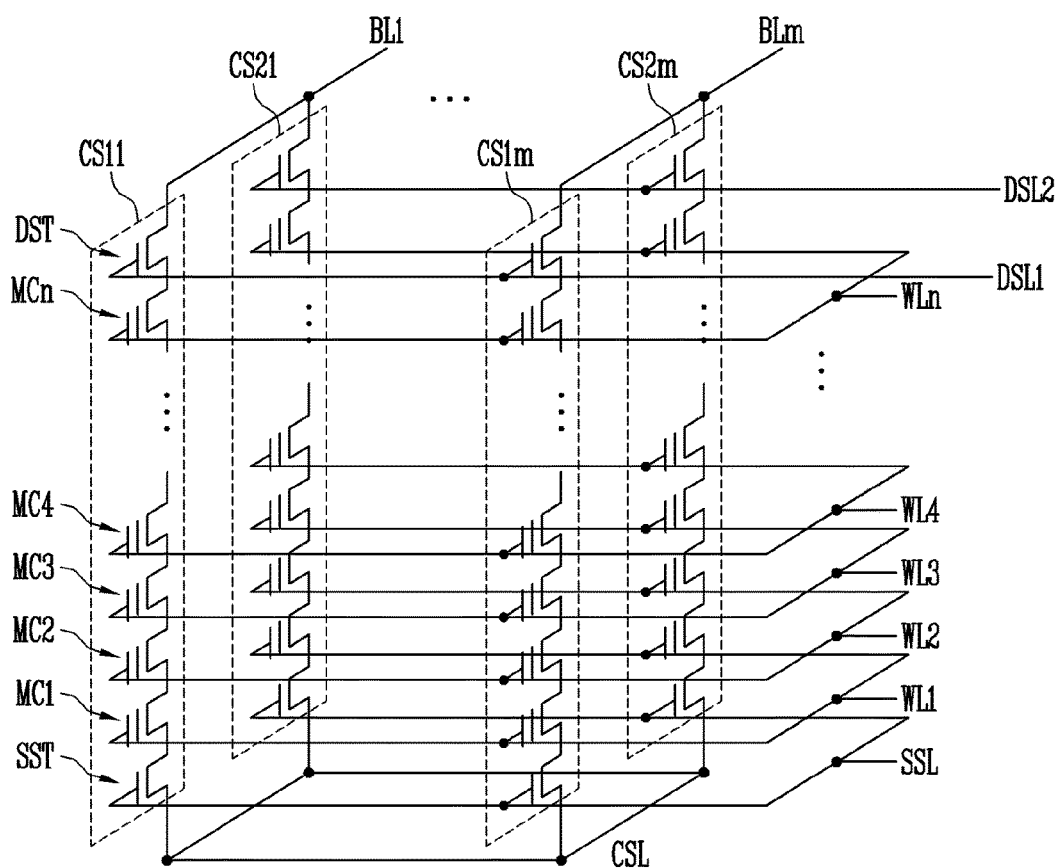
FIG. 2 is a circuit diagram of a memory block according to an embodiment of the present disclosure.
Figure 2:
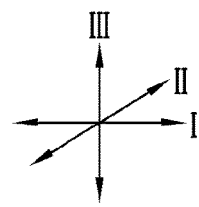

FIG. 2 is a circuit diagram of a memory block according to an embodiment of the present disclosure.

Referring to FIG. 2, the memory block (e.g., BLK1) includes memory cells MC1 to MCn arranged along the extending directions of a first axis I, a second axis II, and a third axis III. First to nth memory cells MC1 to MCn stacked in a line along the extending direction of the third axis III are connected in series to form at least a portion of any one of cell strings CS11 to CS1$m$ and CS21 to CS2$m$. Each of the cell strings CS11 to CS1$m$ and CS21 to CS2$m$ further includes a source select transistor SST connected in series to the first memory cell MC1 and a drain select transistor DST connected in series to the nth memory cell MCn. The first to nth memory cells MC1 to MCn are disposed between the source select transistor SST and the drain select transistor DST.

Each of the cell strings CS11 to CS1$m$ and CS21 to CS2$m$ may include at least one source select transistor SST. The source select transistor SST is stacked under the first memory cell MC1, and is electrically connected to the first memory cell MC1. Although not shown in this figure, source select transistors SST in two or more layers, which are connected in series, may be stacked under the first memory cell MC1. The source select transistor SST is electrically connected to a common source line CSL. The common source line CSL may be disposed under the source select transistor SST.

Each of the cell strings CS11 to CS1$m$ and CS21 to CS2$m$ may include at least one drain select transistor DST. The drain select transistor DST is stacked over the nth memory cell MCn, and is electrically connected to the nth memory cell MCn. Although not shown in this figure, drain select transistors DST in two or more layers, which are connected in series, may be stacked over the nth memory cell MCn. The drain select transistor DST is electrically connected to any one of bit lines BL1 to BLm. The bit lines BL1 to BLm may be disposed over the drain select transistor DST.

Gates of the first to nth memory cells MC1 to MCn are connected to first to nth word lines WL1 to WLn. The first to nth word lines WL1 to WLn are disposed at different levels.

Gates of the source select transistors SST of the cell strings CS11 to CS1$m$ and CS21 to CS2$m$ are connected to a source select line SSL. The source select line SSL is disposed at a lower level than the first to nth word lines WL1 to WLn.

The bit lines BL1 to BLm may be arranged to be spaced apart from each other in the extending direction of the first axis I. The cell strings CS11 to CS1$m$ and CS21 to CS2$m$ may be divided into first to mth columns arranged in the extending direction of the first axis I. The first to mth columns of the cell strings CS11 to CS1$m$ and CS21 to CS2$m$ are connected to the bit lines BL1 to BLm corresponding thereto. For example, the cell strings CS11 and CS21 in the first column are connected to a first bit line BL1, and the cell strings CS1$m$ and CS2$m$ in the mth column are connected to an mth bit line BLm.

The cell strings CS11 to CS1$m$ and CS21 to CS2$m$ may be divided into first and second groups arranged in the extending direction of the second axis II intersecting the first axis I. The first and second groups of the cell strings CS11 to CS1$m$ and CS21 to CS2$m$ are connected to first and second drain select lines DSL1 and DSL2, respectively. For example, drain select transistors DST included in the cell strings CS11 to CS1$m$ of the first group are connected to the first drain select line DSL1, and drain select transistors DST included in the cell strings CS21 to CS2$m$ of the second group are connected to the second drain select line DSL2. The cell strings CS11 to CS1$m$ included in the first group may be arranged in a zigzag pattern. The cell strings CS21 to CS2$m$ included in the second group may be arranged in a zigzag pattern.

The cell strings CS11 to CS1$m$ and CS21 to CS2$m$ may be electrically connected to the common source line CSL and the bit lines BL1 to BLm through channel layers. The common source line CSL and the cell strings CS11 to CS1$m$ and CS21 to CS2$m$ may be implemented through stack structures having various structures.

Figure 3A:
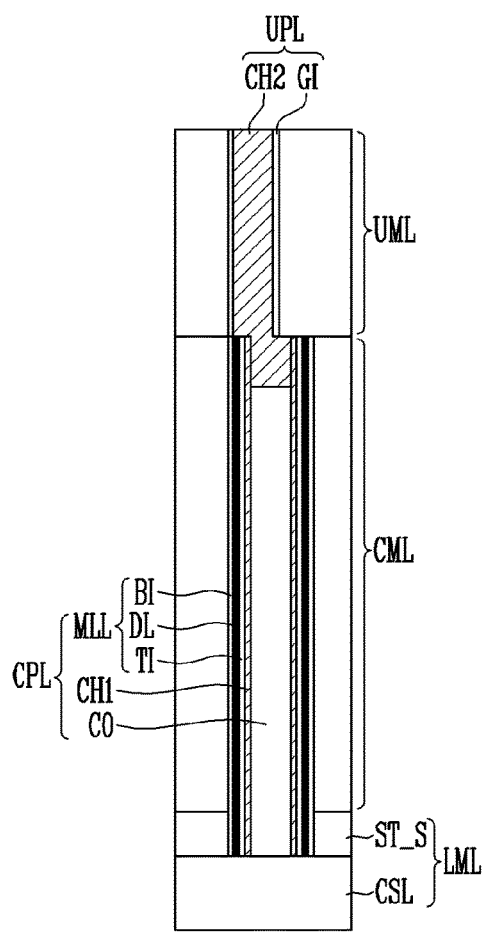
FIGS. 3A and 3B are views schematically illustrating stack structures and channel layers according to embodiments of the present disclosure.
Figure 3B:
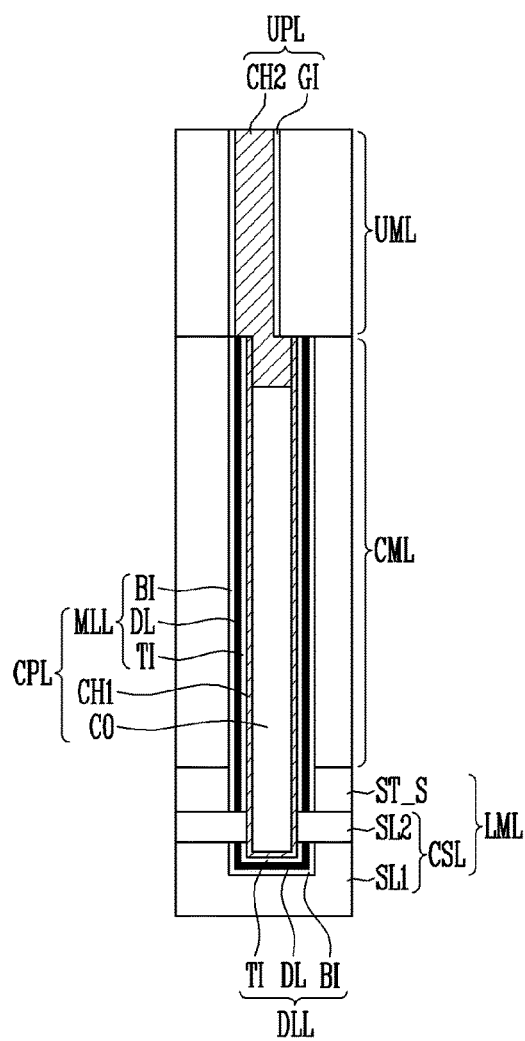

FIGS. 3A and 3B are views schematically illustrating stack structures and channel layers according to embodiments of the present disclosure. Each of the stack structures may be formed into a structure in which two or more layers are stacked. However, for convenience of description, layers constituting each of the stack structures are not illustrated in detail in FIGS. 3A and 3B. The layers constituting each of the stack structures will be described later with reference to FIGS. 4A and 4B.

Referring to FIGS. 3A and 3B, each of semiconductor devices according to embodiments of the present disclosure may include a lower stack structure LML, a cell stack structure CML, and an upper stack structure UML, which are sequentially stacked.

The lower stack structure LML may include a common source line CSL and a source select stack structure ST_S. The common source line CSL is a layer corresponding to the common source line CSL shown in FIG. 2. The source select stack structure ST_S may include the source select line SSL shown in FIG. 2, or may include a source select line SSL in a single layer or source select lines SSL in two or more layers. The source select stack structure ST_S may further include lower insulating layers for insulating between the common source line CSL and the source select line or insulating between the source select lines SSL in the two or more layers.

The cell stack structure CML may include first conductive patterns corresponding to the first to nth word lines WL1 to WLn shown in FIG. 2, and first interlayer insulating layers for insulating between the first conductive patterns. The first interlayer insulating layers and the first conductive patterns may be alternately stacked.

The upper stack structure UML may include the first drain select line DSL1 or the second drain select line DSL2, which is shown in FIG. 2. The upper stack structure UML may include a first drain select line DSL1 in a single layer or a second drain select line DSL2 in a single layer. Alternatively, the upper stack structure UML may include first drain select lines DSL1 in two or more layers or second drain select lines DSL2 in two or more layers. The upper stack structure UML may further include a second interlayer insulating layer in a single layer or second interlayer insulating layers in two or more layers.

The lower stack structure LML and the cell stack structure CML are penetrated by a cell pillar CPL, and the upper stack structure UML is penetrated by an upper pillar UPL.

The cell pillar CPL may include a first channel layer CH1 and a multi-layered liner layer MLL surrounding the first channel layer CH1. The first channel layer CH1 may be formed as a hollow type or a buried type. A central region of the hollow-type first channel layer CH1 may be filled with a core insulating layer CO. Although not shown in these figures, the buried-type first channel layer CH1 is defined as a structure in which even a central region of a hole defined by the multi-layered liner layer MLL is completely filled with a semiconductor layer. The multi-layered liner layer MLL may include a tunnel insulating layer TI surrounding the first channel layer CH1, a data storage layer DL surrounding the tunnel insulating layer TI, and a blocking insulating layer BI surrounding the data storage layer DL. The data storage layer DL may be formed of a material layer in which data can be stored. For example, the data storage layer DL may be formed of a silicon nitride layer.

The upper pillar UPL may include a second channel layer CH2 contacting the first channel layer CH1 of the cell pillar CPL and a gate insulating layer GI surrounding a sidewall of the second channel layer CH2. When the first channel layer CH1 is formed as the hollow type, the second channel layer CH2 may extend toward the central region of the first channel layer CH1 to contact an upper inner wall of the hollow-type first channel layer CH1. A portion of the second channel layer CH2 penetrating the upper stack structure UML may be disposed as biased to one side of the first channel layer CH1.

The first channel layer CH1 may contact a top surface of the common source line CSL as shown in FIG. 3A, or may contact a sidewall of the common source line CSL.

Referring to FIG. 3A, the cell pillar CPL may contact the top surface of the common source line CSL by penetrating the cell stack structure CML and the source select stack structure ST_S of the lower stack structure LML.

Referring to FIG. 3B, the common source line CSL may include a first source layer SL1 and a second source layer SL2 stacked on the first source layer SL1. The first channel layer CH1 of the cell pillar CPL may extend to penetrate the cell stack structure CML and the source select stack structure ST_S and the second source layer SL2 of the lower stack structure LML. A bottom surface of the first channel layer CH1 may be disposed inside the first source layer SL1. The multi-layered liner layer MLL of the cell pillar CPL extends between the first channel layer CH1 and the cell stack structure CML, and between the first channel layer CH1 and the source select stack structure ST_S. A dummy liner layer DLL may be disposed between the first channel layer CH1 and the first source layer SL1. The dummy liner layer DLL and the multi-layered liner layer MLL may be isolated from each other by the second source layer SL2. Like the multi-layered liner layer MLL, the dummy liner layer DLL may include a tunnel insulating layer TI, a data storage layer DL, and a blocking insulating layer BI.

The embodiments of the present disclosure disclose various structures of the cell stack structure CML and the upper stack structure UML, shown in FIGS. 3A and 3B, manufacturing methods of the structures, and arrangements of the upper pillars UPL penetrating the upper stack structure. Hereinafter, layers constituting the cell stack structure CML and the upper stack structure UML will be described in detail with reference to FIGS. 4A and 4B.

Figure 4A:
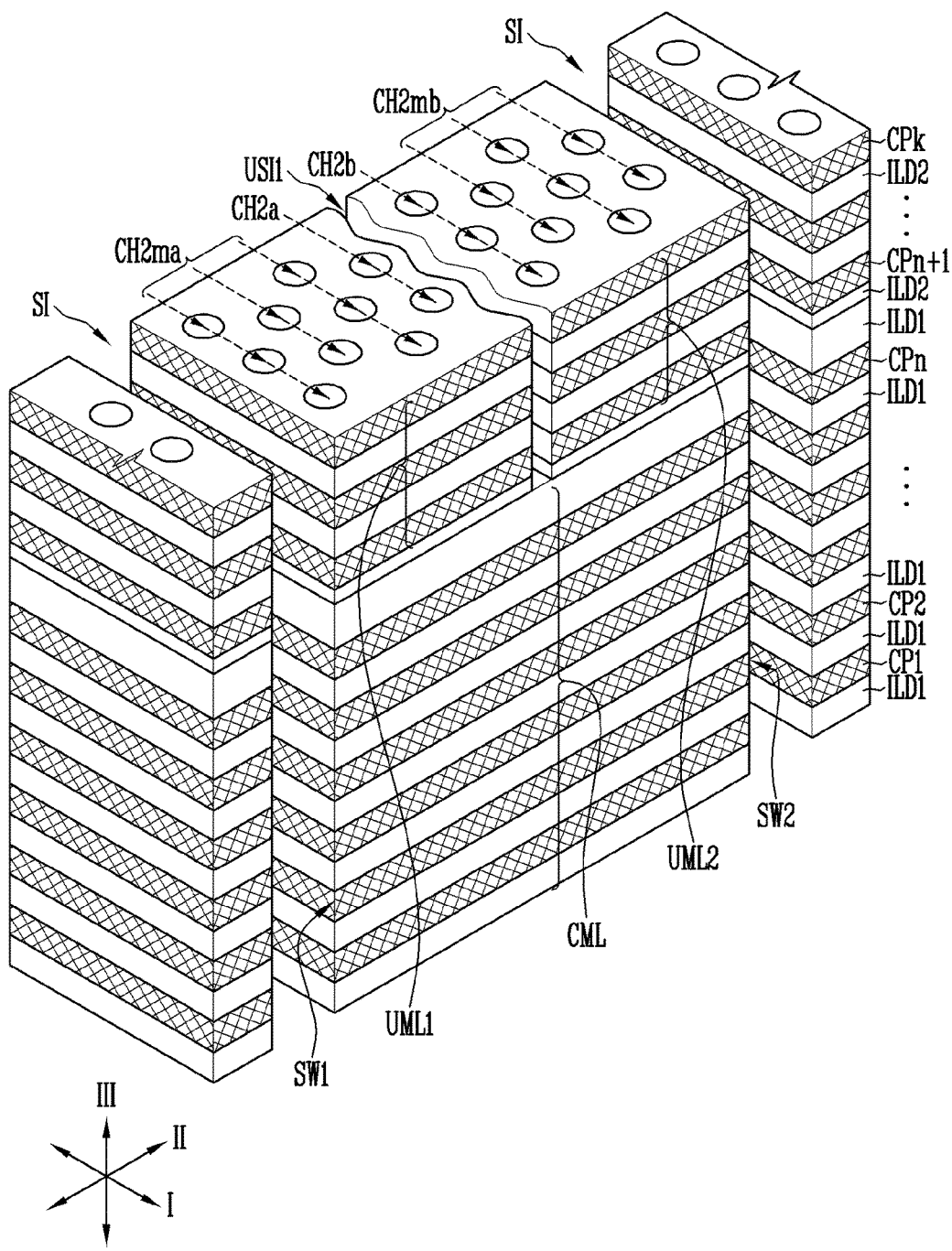
FIGS. 4A and 4B are perspective views illustrating cell stack structures and upper stack structures according to embodiments of the present disclosure.
Figure 4B:
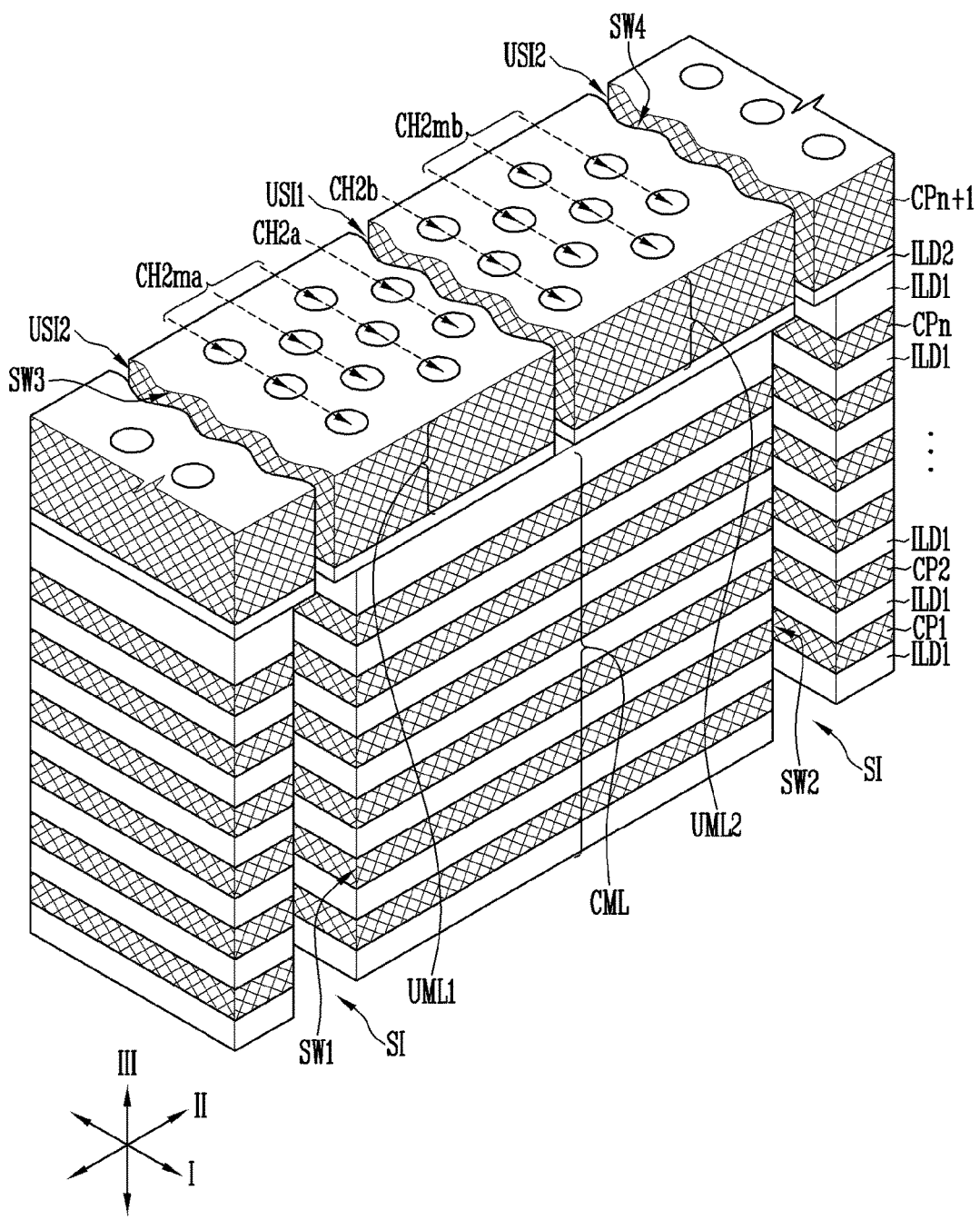

FIGS. 4A and 4B are perspective views illustrating cell stack structures and upper stack structures according to embodiments of the present disclosure.

Referring to FIGS. 4A and 4B, each of semiconductor devices according to embodiments of the present disclosure include cell stack structures CML isolated from each other by the slits SI, and first and second upper stack structures UML1 and UML2 disposed on each of the cell stack structures CML.

Each of the cell stack structures CML includes first interlayer insulating layers ILD1 and first conductive patterns CP1 to CPn, which are alternately stacked. The first conductive patterns CP1 to CPn correspond to the first to nth word lines WL1 to WLn described in FIG. 2.

The cell stack structures CML may extend along an extending direction of the first axis I, and the cell stack structures CML may be isolated from each other by the slits SI. Accordingly, the cell stack structures CML have sidewalls defined along sidewalls of the slits SI. For example, each of the cell stack structures CML may include a first sidewall SW1 and a second sidewall SW2. The slits SI may extend side by side in the extending direction of a first axis I, and the first and second sidewalls SW1 and SW2 may extend in the extending direction of the first axis I. The first and second sidewalls SW1 and SW2 face in both directions of the second axis II intersecting the first axis I. Specifically, the first sidewall SW1 faces one direction of the second axis II, and the second sidewall SW2 faces the opposite direction of the second axis II.

The cell stack structures CML are penetrated by first channel layers. The first channel layers may be divided into a first column, a second column, and a plurality of columns. An arrangement of the first channel layers will be described in detail later with reference to FIGS. 5A and 6A.

The slits SI isolating the cell stack structures CML from each other, as shown in FIG. 4A, may extend to define one sidewall of the first upper stack structure UML1 and one sidewall of the second upper stack structure UML2. In this case, the first sidewall SW1 may extend up to the height of the first upper stack structure UML1, and the second sidewall SW2 may extend up to the height of the second upper stack structure UML2.

Alternatively, the slits SI isolating the cell stack structures CML from each other, as shown in FIG. 4B, do not penetrate the first upper stack structure UML1 and the second upper stack structure UML2, but may extend to only the height of the cell stack structures CML to isolate only the cell stack structures CML from each other. In this case, the first upper stack structure UML1 and the second upper stack structure UML2 may have sidewalls defined by second upper slits USI2. The second upper slits USI2 are disposed with a first upper slit USI1 interposed between the second upper slits USI2, and may define a third sidewall SW3 of the first upper stack structure UML1 and a fourth sidewall SW4 of the second upper stack structure UML2. The first upper stack structure UML1 and the second upper stack structure UML2 may be adjacent to each other and disposed between the second upper slits USI2. The second upper slits USI2 are formed using a process of forming the first upper slit USI1. When the width of the first upper slit USI1 is formed narrower than each of the slits SI so as to decrease a cell size, the width of each of the second upper slits USI2 simultaneously formed with the first upper slits USI1 is formed narrower than that of each of the slits SI. As the width of the second upper slits USI2 is formed narrower than that of the slits SI, the third sidewall SW3 may protrude further than the first sidewall SW1, and the fourth sidewall SW4 may protrude further than the second sidewall SW2.

Referring to FIGS. 4A and 4B, each of the first and second upper stack structures UML1 and UML2 may include one set of a second interlayer insulating layer ILD2 and a second conductive pattern (any one of CPn+1 to CPk), which are sequentially stacked, or may be formed by stacking two or more sets of a stack structure of a second interlayer insulating layer ILD2 and a second conductive pattern (any one of CPn+1 to CPk), which are sequentially stacked.

For example, each of the first and second upper stack structures UML1 and UML2, as shown in FIG. 4A, may be formed into a structure in which a second interlayer insulating layers ILD2 and second conductive patterns CPn+1 to CPk are alternately stacked. Each of the first and second upper stack structures UML1 and UML2 may include second conductive patterns CPn+1 to CPk in two or more layers. That is, k may be a natural number of (n+2) or more. The second conductive patterns CPn+1 to CPk of the first upper stack structure UML1 may correspond to first drain select lines, and the second conductive patterns CPn+1 to CPk of the second upper stack structure UML2 may correspond to second drain select lines. The first drain select lines are connected to gates of the drain select transistors in two or more layers, which constitute each of the cell strings CS11 to CS1m in the first group, described in FIG. 2, and the second drain select lines are connected to gates of the drain select transistors in two or more layers, which constitute each of the cell strings CS21 to CS2m in the second group, described in FIG. 2.

Alternatively, each of the first and second upper stack structures UML1 and UML2, as shown in FIG. 4B, may be formed into a structure in which a second interlayer insulating layer ILD2 in a single layer and a second conductive pattern CPn+1 in a single layer are stacked. In this case, the second conductive pattern CPn+1 may be formed to have a thickness that is thicker than first conductive patterns CP1 to CPn. The second conductive pattern CPn+1 of the first upper stack structure UML1 may correspond to the first drain select line DSL1 described in FIG. 2, and the second conductive pattern CPn+1 of the second upper stack structure UML2 may correspond to the second drain select line DSL2 described in FIG. 2.

Referring to FIGS. 4A and 4B, each of the first and second upper stack structures UML1 and UML2 is penetrated by second channel layers CH2a, CH2b, CH2ma, and CH2mb. The second channel layers CH2a, CH2b, CH2ma, and CH2mb may be divided into second channel layers CH2a in a first column, second channel layers CH2b in a second column, and second channel layers CH2ma and CH2mb in a plurality of columns. The second channel layers CH2a in the first column may penetrate the first upper stack structure UML1, and the second channel layers CH2b in the second column penetrate the second upper stack structure UML2. The second channel layers CH2a in the first column and the second channel layers CH2b in the second column are disposed adjacent to the first upper slit USI1. The first upper slit USI1 is disposed between the second channel layers CH2a in the first column and the second channel layers CH2b in the second column.

The second channel layers CH2ma and CH2mb in the plurality of columns may include second channel layers CH2ma in a first group which penetrate the first upper stack structure UML1, and second channel layers CH2mb in a second group which penetrate the second upper stack structure UML2. The second channel layers CH2ma in the first group are disposed between the first sidewall SW1 and the second channel layers CH2a in the first column, and the second channel layers CH2mb in the second group are disposed between the second sidewall SW2 and the second channel layers CH2b in the second column.

In order to obtain a dense arrangement, the second channel layers CH2a, CH2b, CH2ma, and CH2mb may be arranged in a zigzag pattern. The second channel layers CH2a, CH2b, CH2ma, and CH2mb may extend to contact the first channel layers. The second channel layers CH2a, CH2b, CH2ma, and CH2mb may overlap with the first channel layers. An arrangement of the second channel layers CH2a, CH2b, CH2ma, and CH2mb and the first channel layers will be described in detail later with reference to FIGS. 5A and 6A.

The first upper slit USI1 disposed between the second channel layers CH2a in the first column and the second channel layers CH2b in the second column may be formed in a wave shape along the extending direction of the first axis I, to minimize spacing distances between the second channel layers CH2a in the first column and the second channel layers CH2b in the second column. More specifically, the wave-shaped first upper slit USI1 may be formed to be bent along outer shapes of the second channel layers CH2a in the first column and the second channel layers CH2b in the second column.

The second upper slits USI2 simultaneously formed with the first upper slits USI1, as shown in FIG. 4B, may be formed in a wave shape along the extending direction of the first axis I.

Figure 5A:
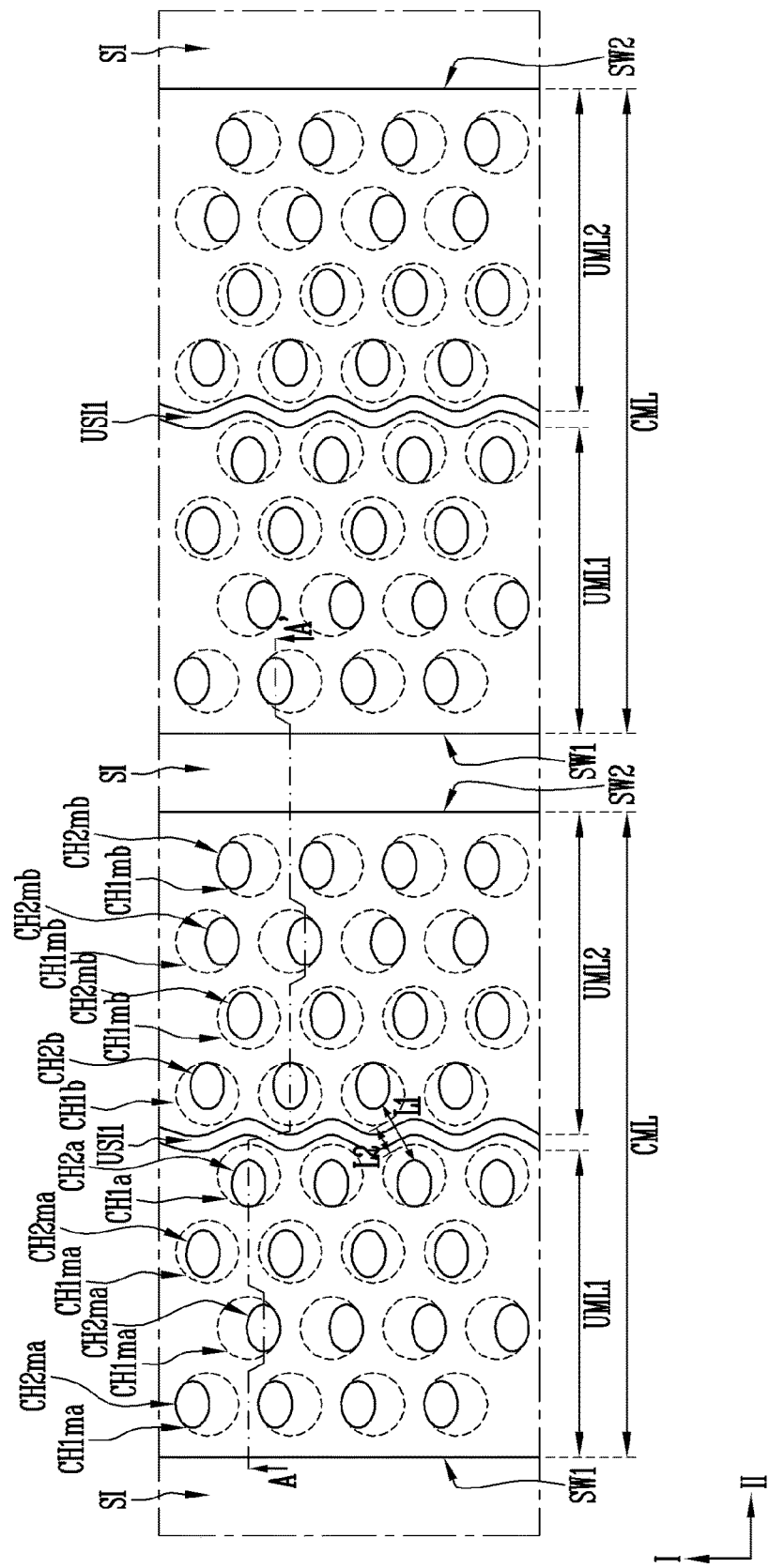
FIGS. 5A and 5B are plan and sectional views of a semiconductor device according to an embodiment of the present disclosure.
Figure 5B:
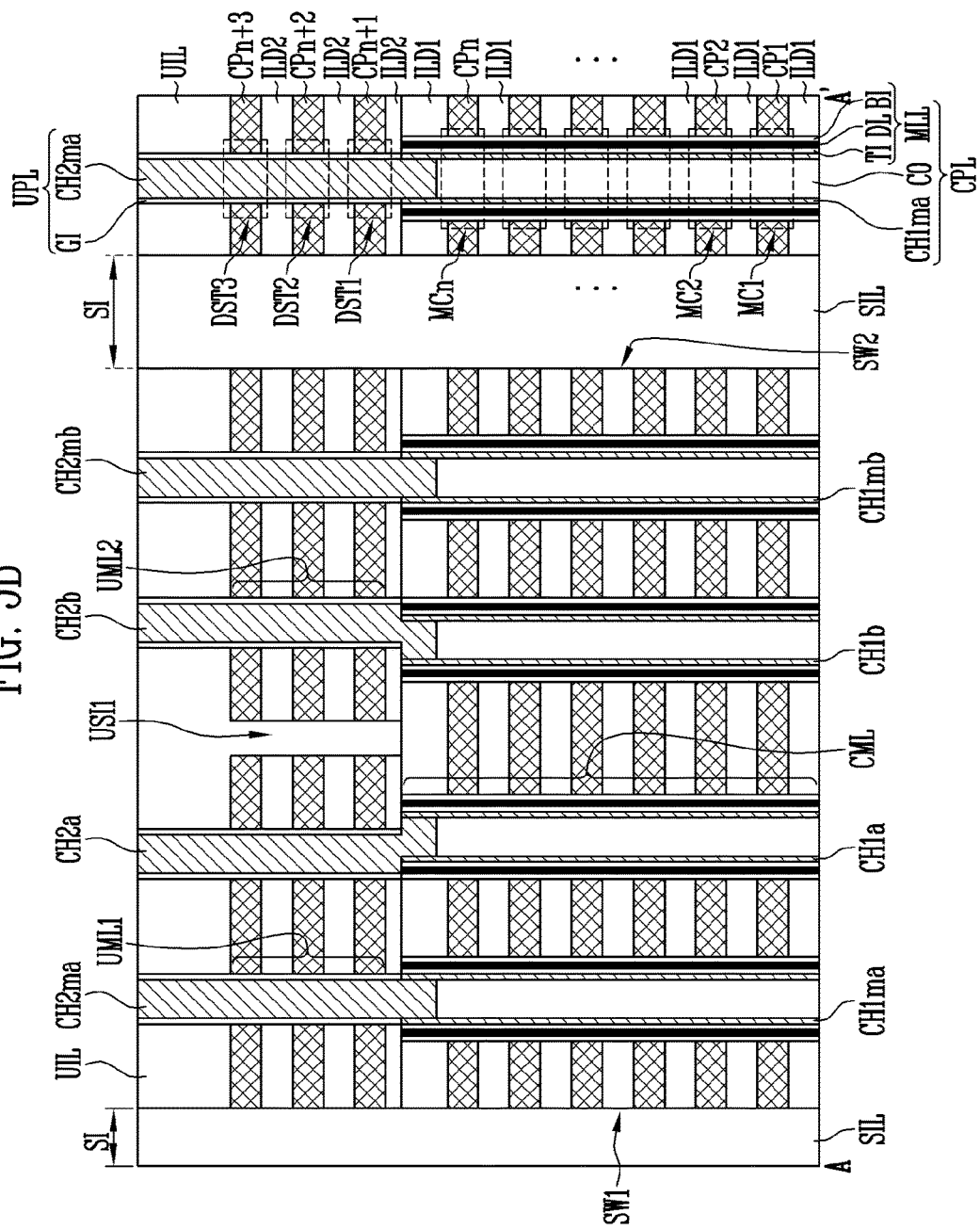

FIGS. 5A and 5B are plan and sectional views of a semiconductor device according to an embodiment of the present disclosure. Particularly, FIGS. 5A and 5B are plan and sectional views illustrating structures of a cell stack structure and first and second upper stack structures in the semiconductor device according to an embodiment of the present disclosure.

Referring to FIG. 5A, each of cell stack structures CML isolated from each other by slits SI has a first sidewall SW1 and a second sidewall SW2, which respectively face in both directions of a second axis II intersecting a first direction I. Each of the cell stack structures CML are disposed under a first upper stack structure UML1 and a second upper stack structure UML2 which are isolated from each other by a first upper slit USI1, and each of the cell stack structures CML overlaps with a pair of the first and second upper stack structures UML1 and UML2.

Each of the cell stack structures CML is penetrated by first channel layers CH1a, CH1b, CH1ma, and CH1mb. In order to obtain a dense arrangement, the first channel layers CH1a, CH1b, CH1ma, and CH1mb may be arranged in a zigzag pattern.

The first channel layers CH1a, CH1b, CH1ma, and CH1mb may be arranged in a matrix form, and each column of the first channel layers CH1a, CH1b, CH1ma, and CH1mb is formed along the extending direction of the first axis I. The first channel layers CH1a, CH1b, CH1ma, and CH1mb may be divided into first channel layers CH1a in a first column, first channel layers CH1b in a second column, and first channel layers CH1ma and CH1mb in a plurality of columns. The first channel layers CH1a in the first column and the first channel layers CH1b in the second column correspond to columns disposed at the center of the first channel layers CH1a, CH1b, CH1ma, and CH1mb penetrating each of the cell stack structures CML. The first upper slit USI1 extends along a boundary between the first channel layers CH1a in the first column and the first channel layers CH1b in the second column.

The first channel layers CH1ma and CH1mb in the plurality of columns may include first channel layers CH1ma in a first group, which overlap with the first upper stack structure UML1, and first channel layers CH1mb in a second group, which overlap with the second upper stack structure UML2. The first channel layers CH1ma in the first group may be arranged in a zigzag pattern between the first sidewall SW and the first channel layers CH1a in the first column. The first channel layers CH1mb in the second group may be arranged in a zigzag pattern between the second sidewall SW2 and the first channel layers CH1b in the second column.

Second channel layers CH2a, CH2b, CH2ma, and CH2mb and the first upper slit USI1 may be arranged as described in FIG. 4A, and the first upper slit USI1 may be formed in a wave shape as described in FIG. 4A. The diameter of the second channel layers CH2a, CH2b, CH2ma, and CH2mb may be formed smaller than that of the first channel layers CH1a, CH1b, CH1ma, and CH1mb. The second channel layers CH2a, CH2b, CH2ma, and CH2mb may overlap the first channel layers CH1a, CH1b, CH1ma, and CH1mb.

Specifically, second channel layers CH2a in a first column overlap with the first channel layers CH1a in the first column, and second channel layers CH2b in a second column overlap with the first channel layers CH1b in the second column. Also, second channel layers CH2ma in a first group overlap with the first channel layers CH1ma in the first group, and second channel layers CH2mb in a second group overlap with the first channel layers CH1mb in the second group. The second channel layers CH2a in the first column may overlap with the first channel layers CH1a in the first column to be biased to one side of the first channel layers CH1a in the first column, which face the first sidewall SW1. The second channel layers CH2b in the second column may overlap with the first channel layers CH1b in the second column to be biased to one side of the first channel layers CH1b in the second column, which face the second sidewall SW2. According to such an arrangement, the distances L1 between the second channel layers CH2a in the first column and the second channel layers CH2b in the second column are widened within a limited space, so that a forming space of the first upper slit USI1 can be secured.

The distances L2 between the first channel layers CH1a in the first column and the first channel layers CH1b in the second column may be formed to be narrow so as to improve the degree of integration of memory cells. According to the above-described arrangement of the second channel layers CH2a in the first column and the second channel layers CH2b in the second column, each of the distances L1 between the second channel layers CH2a in the first column and the second channel layers CH2b in the second column may be formed to be greater than each of the distances L2 between the first channel layers CH1a in the first column and the first channel layers CH1b in the second column.

The first upper slit USI1 disposed between the second channel layers CH2a in the first column and the second channel layers CH2b in the second column may be formed in a wave shape along outer edges of the second channel layers CH2a in the first column and the second channel layers CH2b in the second column.

Hereinafter, sections of the cell stack structure CML and the first and second upper stack structures UML1 and UML2 will be described in detail with reference to FIG. 5B illustrating a section taken along line A-A' shown in FIG. 5A. In FIG. 5B, a case where each of the first and second upper stack structures UML1 and UML2 includes second conductive patterns in three layers is described as an example, but the present disclosure is not limited thereto. For example, each of the first and second upper stack structures UML1 and UML2 may include second conductive patterns in two layers, or may include a second conductive pattern in a single layer.

Referring to FIG. 5B, the cell stack structure CML, as described in FIG. 4, includes first interlayer insulating layers ILD1 and first conductive patterns CP1 to CPn. The first conductive patterns CP1 to CPn are connected to gates of memory cells MC1 to MCn. The first interlayer insulating layers ILD1 and the conductive patterns CP1 to CPn are penetrated by the slits SI. The slits SI define the first sidewall SW1 and the second sidewall SW2.

Each of the first and second upper stack structures UML1 and UML2 may include second interlayer insulating layers ILD2 and second conductive patterns CPn+1 to CPn+3, which are alternately stacked. The second conductive patterns CPn+1 to CPn+3 may be connected to gates of the drain select transistors DST1 to DST3, respectively.

The first upper slit USI1 isolating the first and second upper stack structures UML1 and UML2 from each other may be filled with an upper slit insulating layer UIL. The upper slit insulating layer UIL may extend to cover the first and second upper stack structures UML1 and UML2. The first sidewall SW1 defined by any one of the slits SI may extend to become one sidewall of the first upper stack structure UML1, and the second sidewall SW2 defined by any one of the slits SI may extend to become one sidewall of the second upper stack structure UML2. The slits SI may extend to penetrate the upper slit insulating layer UIL. Each of the slits SI may be filled with a slit insulating layer SIL.

The cell stack structure CML is penetrated by cell pillars CPL, and the first and second upper stack structures UML1 and UML2 are penetrated by upper pillars UPL. The upper pillars UPL may extend to penetrate at least the upper slit insulating layer UIL.

Each of the cell pillars CPL may include a multi-layered liner layer MLL and any one of the first channel layers CH1a, CH1b, CH1ma, and CH1mb surrounded by the multi-layered liner layer MLL. Also, each of the cell pillars CPL may further include a core insulating layer CO. The multi-layered liner layer MLL, as described in FIGS. 3A and 3B, may include a tunnel insulating layer TI, a data storage layer DL, and a blocking insulating layer BI. The core insulating layer CO, as described in FIGS. 3A and 3B, may be surrounded by any one of the first channel layers CH1a, CH1b, CH1ma, and CH1mb.

The first channel layers CH1a, CH1b, CH1ma, and CH1mb, as described in FIG. 5A, include first channel layers CH1a in a first column, first channel layers CH1b in a second column, and first channel layers CH1ma and CH1mb in a plurality of columns.

Each of the upper pillars UPL may include a gate insulating layer GI and any one of the second channel layers CH2a, CH2b, CH2ma, and CH2mb surrounded by the gate insulating layer GI.

According to an embodiment of the present disclosure, the gate insulating layer GI surrounding each of the second channel layers CH2a, CH2b, CH2ma, and CH2mb is formed through a process distinguished from that of the multi-layered liner layer MLL surrounding each of the first channel layers CH1a, CH1b, CH1ma, and CH1mb. Therefore, the gate insulating layer GI may be formed using a structure and materials, which are independent from the multi-layered liner layer MLL. Particularly, the gate insulating layer GI may be formed of material layers capable of improving characteristics of the drain select transistors DST. For example, the gate insulating layer GI may be formed into a double-layer structure of a silicon oxide layer and an aluminum oxide layer ($Al_2O_3$). Accordingly, in an embodiment of the present disclosure, it is possible to decrease a leakage current of the drain select transistors DST and to reduce degradation of the characteristics of the drain select transistors DST due to stress of read and write operations. Unlike an embodiment of the present disclosure, when the gate insulating layer GI is formed of the same material layers as the multi-layered liner layer MLL, characteristics of the drain select transistors DST may be degraded due to stress of the read and write operations, and a sensing margin may be decreased due to the leakage current of the drain select transistors DST.

The second channel layers CH2a, CH2b, CH2ma, and CH2mb, as described in FIG. 5B, include second channel layers CH2a in a first column, second channel layers CH2b in a second column, and second channel layers CH2ma and CH2mb in a plurality of columns penetrating the first and second upper stack structures UML1 and UML2. The second channel layers CH2a, CH2b, CH2ma, and CH2mb may extend to contact the first channel layers CH1a, CH1b, CH1ma, and CH1mb, and may extend to the inside of the first channel layers CH1a, CH1b, CH1ma, and CH1mb.

Figure 6B:
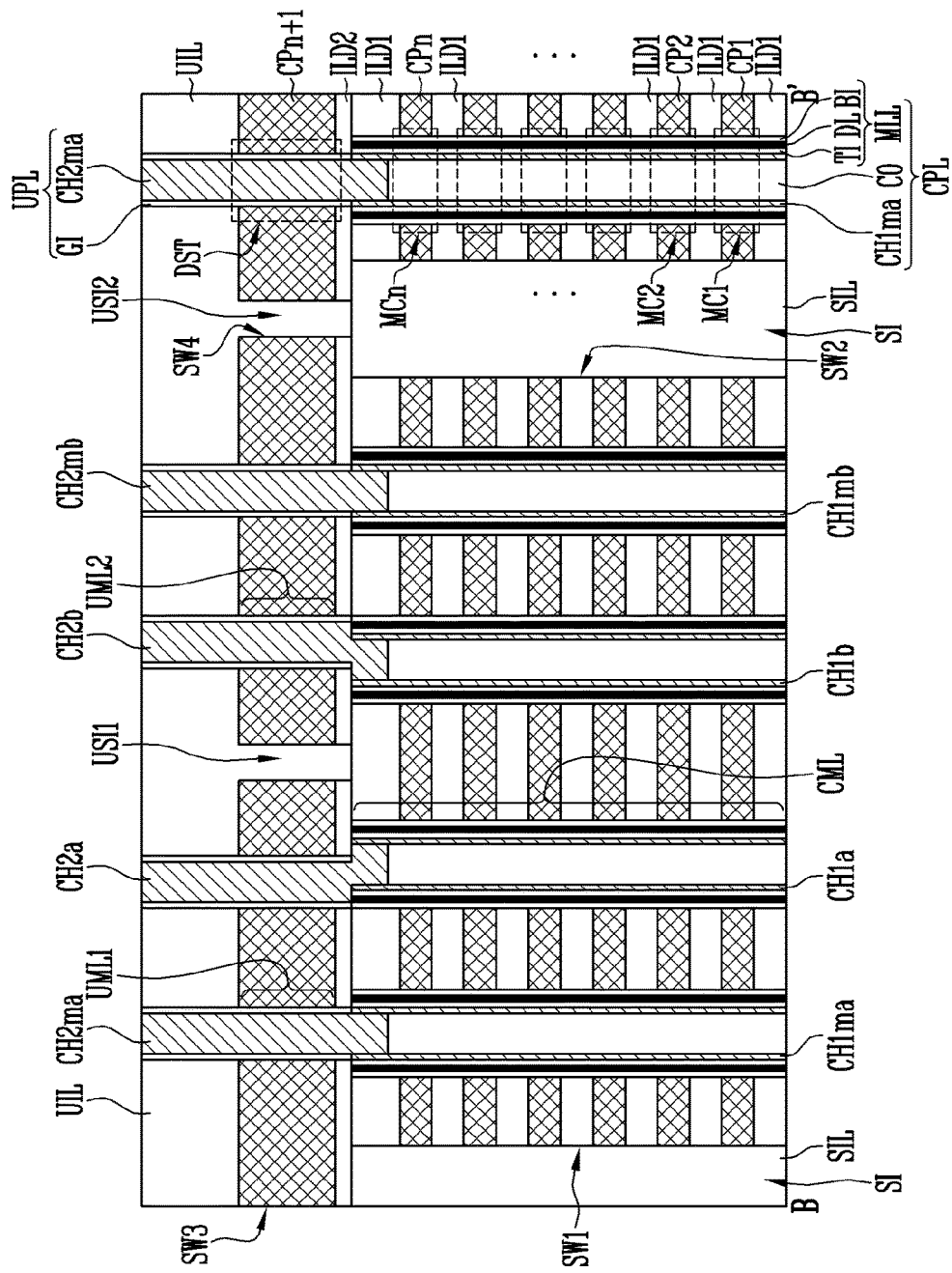

FIGS. 6A and 6B are plan and sectional views of a semiconductor device according to an embodiment of the present disclosure. Particularly, FIGS. 6A and 6B are plan and sectional views illustrating structures of a cell stack structure and first and second upper stack structures in a semiconductor device according to an embodiment of the present disclosure.

Referring to FIG. 6A, cell stack structures CML may be formed as the same structure as described in FIG. 5A. Schematically, the cell stack structures CML are isolated from each other by slits SI. Each of the slits SI may include a portion covered with a first upper slit structure UML1 and a second upper stack structure UML2. Each of the cell stack structures CML has a first sidewall SW1 and a second sidewall SW2, which respectively face in both directions of a second axis II intersecting a first axis I. Each of the cell stack structures CML is penetrated by first channel layers CH1a, CH1b, CH1ma, and CH1mb. The first channel layers CH1a, CH1b, CH1ma, and CH1mb are arranged in a substantially similar manner as described in FIG. 5A.

The first upper stack structure UML1 and the second upper stack structure UML2 are isolated from each other by a first upper slit USI1 overlapping with any one of the cell stack structures CML. The first upper slit USI1 is disposed between second upper slits USI2. The second upper slits USI2 overlap with the slits SI, and are formed with a narrower width than the slits SI. The second upper slits USI2 may define a third sidewall SW3 of the first upper stack structure UML1 and a fourth sidewall SW4 of the second upper stack structure UML2. The third sidewall SW3 may protrude further in the direction of the second axis II than the first sidewall SW1. The fourth sidewall SW4 may protrude further in the direction of the second axis II than the second sidewall SW2.

Second channel layers CH2a, CH2b, CH2ma, and CH2mb and the first upper slit USI1 may be arranged as described in FIG. 4B, and the first and second upper slits USI1 and USI2 may be formed in a wave shape as described in FIG. 4B. The diameter of the second channel layers CH2a, CH2b, CH2ma, and CH2mb may be formed smaller than that of the first channel layers CH1a, CH1b, CH1ma, and CH1mb. The second channel layers CH2a, CH2b, CH2ma, and CH2mb may overlap with the first channel layers CH1a, CH1b, CH1ma, and CH1mb.

The first channel layers CH1a, CH1b, CH1ma, and CH1mb and the second channel layers CH2a, CH2b, CH2ma, and CH2mb may be arranged in a substantially similar manner as described in FIG. 5A. As described in FIG. 5A, each of the distances L1 between second channel layers CH2a in a first column and second channel layers CH2b in a second column may be formed wider than each of the distances L2 between first channel layers CH1a in a first column and first channel layers CH1b in a second column.

Hereinafter, sections of the cell stack structure CML and the first and second upper stack structures UML1 and UML2 will be described in detail with reference to FIG. 6B illustrating a section taken along line B-B' shown in FIG. 6A. In FIG. 6B, a case where each of the first and second upper stack structures UML1 and UML2 includes a second conductive pattern in a single layer is described as an example, but the present disclosure is not limited thereto. For example, each of the first and second upper stack structures UML1 and UML2 may include second conductive patterns in two or more layers.

Referring to FIG. 6B, the cell stack structure CML, as described in FIG. 4B, includes first interlayer insulating layers ILD1 and first conductive patterns CP1 to CPn. The first conductive patterns CP1 to CPn are connected to gates of memory cells MC1 to MCn. The first interlayer insulating layers ILD1 and the first conductive patterns CP1 to CPn are penetrated by the slits SI. The slits SI define the first and second sidewalls SW1 and SW2 of the cell stack structure CML.

Each of the first and second upper stack structures UML1 and UML2 may include a second interlayer insulating layer ILD2 and a second conductive pattern CPn+1, which are sequentially stacked. The second conductive pattern CPn+1 is connected to a gate of a drain select transistor DST.

The first and second upper slits USI1 and USI2 defining the first and second upper stack structures UML1 and UML2 may be filled with an upper slit insulating layer UIL. The upper slit insulating layer UIL may extend to cover the first and second upper stack structures UML1 and UML2. Slit insulating layers SIL filled in the slits SI may overlap with the upper slit insulating layer UIL. The second upper slits USI2 overlap with the slits SI, and may be formed with a narrower width than the slits SI. The third sidewall SW3 of the first upper stack structure UML1, which protrudes further than the first sidewall SW1, overlaps with any one of the slit insulating layers SIL. The fourth sidewall SW4 of the second upper stack structure UML2, which protrudes further than the second sidewall SW2, overlaps with any one of the slit insulating layers SIL.

The cell stack structure CML is penetrated by cell pillars CPL, and the first and second upper stack structures UML1 and UML2 are penetrated by upper pillars UPL. The upper pillars UPL extend to penetrate the upper slit insulating layer UIL.

As described in FIG. 5B, each of the cell pillars CPL may include a multi-layered liner layer MLL, any one of the first channel layers CH1a, CH1b, CH1ma, and CH1mb, and a core insulating layer CO. As described in FIGS. 3A and 3B, the multi-layered liner layer MLL may include a tunnel insulating layer TI, a data storage layer DL, a blocking insulating layer BI.

As described in FIG. 5B, each of the upper pillars UPL may include a gate insulating layer GI and any one of the second channel layers CH2a, CH2b, CH2ma, and CH2mb. The gate insulating layer GI may be formed of the material layers described in FIG. 5B.

FIGS. 7A to 7I are sectional views illustrating a manufacturing method of a semiconductor device according to an embodiment of the present disclosure. More specifically, FIGS. 7A to 7I are sectional views illustrating a manufacturing method of the semiconductor device shown in FIGS. 5A and 5B, which are taken along line A-A' shown in FIG. 5A.

Referring to FIG. 7A, a process of forming first channel layers CH1 penetrating a first stack structure ST1 is performed.

The process may include a step of forming the first stack structure ST1 by alternately stacking first interlayer insulating layers 101 and first sacrificial layers 103, a step of forming first holes H1 penetrating the first stack structure ST1, and a step of forming cell pillars CPL filled in the first holes H1.

The first interlayer insulating layers 101 may be formed of an oxide layer, and the first sacrificial layers 103 may be formed of a different material from the first interlayer insulating layers 101. The first sacrificial layers 103 may be formed of a material having an etching selection ratio with respect to the first interlayer insulating layers 101. For example, the first sacrificial layers 103 may be formed of a silicon nitride layer.

The first holes H1 may be formed by etching the first interlayer insulating layers 101 and the first sacrificial layers 103.

The step of forming the cell pillars CPL may include a step of sequentially stacking a blocking insulating layer 111, a data storage layer 113, and a tunnel insulating layer 115 on a sidewall of each of the first holes H1, and a step of forming the first channel layers CH1 on the tunnel insulating layer 115. The first channel layer CH1 may be formed as a burial type to completely filled in each of the first holes H1, or the first channel layer CH1 may be formed as a liner type to open a central region of each of the first holes H1. The blocking insulating layer 111 may be formed of an oxide layer. The data storage layer 113 may be formed of a silicon nitride layer in which charges can be trapped. The tunnel insulating layer 115 may be formed of a silicon oxide layer. The first channel layer CH1 may be formed of a semiconductor layer such as silicon. When a central region of the first channel layer CH1 is opened, a core insulating layer 119 filled in the central region of the first channel layer CH1 may be further formed. The core insulating layer 119 may be formed of an oxide layer using a flowable material such as polysilazane (PSZ).

The first channel layers CH1 inside the first holes H1 may be divided into a first column a and a second column b, which are adjacent to each other, and a plurality of columns ma and mb. First channel layers CH1 constituting the plurality of columns ma and mb may be divided into a first group ma and a second group mb, which are opposite to each other with the first and second columns a and b interposed therebetween.

The first stack structure ST1 is a preliminary stack structure for forming a stack structure of memory cells.

Referring to FIG. 7B, a second stack structure ST2 is formed on the first stack structure ST1 to cover the cell pillars CPL. The second stack structure ST2 is a preliminary stack structure for forming at least one drain select transistor in a single layer. The second stack structure ST2 includes second interlayer insulating layers 121 and second sacrificial layers 123, which are alternately stacked.

The second interlayer insulating layers 121 may be formed of an oxide layer, and the second sacrificial layers 123 may be formed of a different material from the second interlayer insulating layers 121. The second sacrificial layers 123 may be formed of a material having an etching selection ratio with respect to the second interlayer insulating layers 121. For example, the second sacrificial layers 123 may be formed of a silicon nitride layer.

Referring to FIG. 7C, a first upper slit 131 penetrating the second stack structure (ST2 of FIG. 7B) is formed. The first upper slit 131 may divide the second stack structure (ST2 of FIG. 7B) into sub-stack structures SUB by penetrating the second stack structure (ST2 of FIG. 7B) along a boundary between the first and second columns a and b of the first channel layers CH1. The first upper slit 131 may alternatively be formed in a wave shape as described in FIGS. 4A and 5A.

Subsequently, an upper slit insulating layer 133 is formed. The upper slit insulating layer 133 may be formed to completely fill in the first upper slit 131 and to cover the sub-stack structures SUB.

Referring to FIG. 7D, second holes H2 exposing the first channel layers CH1 therethrough are formed. The second holes H2 may be formed by etching the upper slit insulating layer 133 and the sub-stack structures SUB and penetrating the upper slit insulating layer 133 and the sub-stack structures SUB. The second holes H2 may be formed narrower than the first holes (H1 of FIG. 7A). Some of the second holes H2 are arranged to be biased to one side of the first channel layers CH1 in the first and second columns a and b. More specifically, a second hole H2 opening the first channel layer CH1 in the first column a and a second hole H2 opening the first channel layer CH1 in the second column b overlap with the first channel layer CH1 in the first column a and the first channel layer CH1 in the second column b to be biased to one side of the first channel layer CH1 in the first column a and one side of the first channel layer CH1 in the second column b, which face in both directions of an axis intersecting the first upper slit 131, respectively. In other words, the second hole H2 opening the first channel layer CH1 in the first column a is disposed biased to one side of the first channel layer CH1 in the first column a, which faces the first channel layer CH1 in the first group ma, and the second hole H2 opening the first channel layer CH1 in the second column b is disposed biased to one side of the first channel layer CH1 in the second column b, which faces the first channel layer CH1 in the second group mb.

According to the above-described arrangement of the second holes H2, the distance between the first upper slit 131 and each of the second holes H2 adjacent thereto may be sufficiently secured within a limited area.

Referring to FIG. 7E, a liner insulating layer 141 and a spacer layer 143 are sequentially formed on surfaces of the second holes H2 and the upper slit insulating layer 133. The liner insulating layer 141 may be formed of a material for a gate insulating layer of a drain select transistor. For example, the liner insulating layer 141 may be formed in a single layer of a silicon oxide layer as a material layer, or may be formed in a multiple layers including a silicon oxide layer and a high dielectric oxide layer. An aluminum oxide layer may be used as the high dielectric oxide layer. The spacer layer 143 may be formed of a material layer formed to protect the liner insulating layer 141 in a subsequent etch-back process. For example, the spacer layer 143 may be formed of a nitride layer.

Figure 7F:
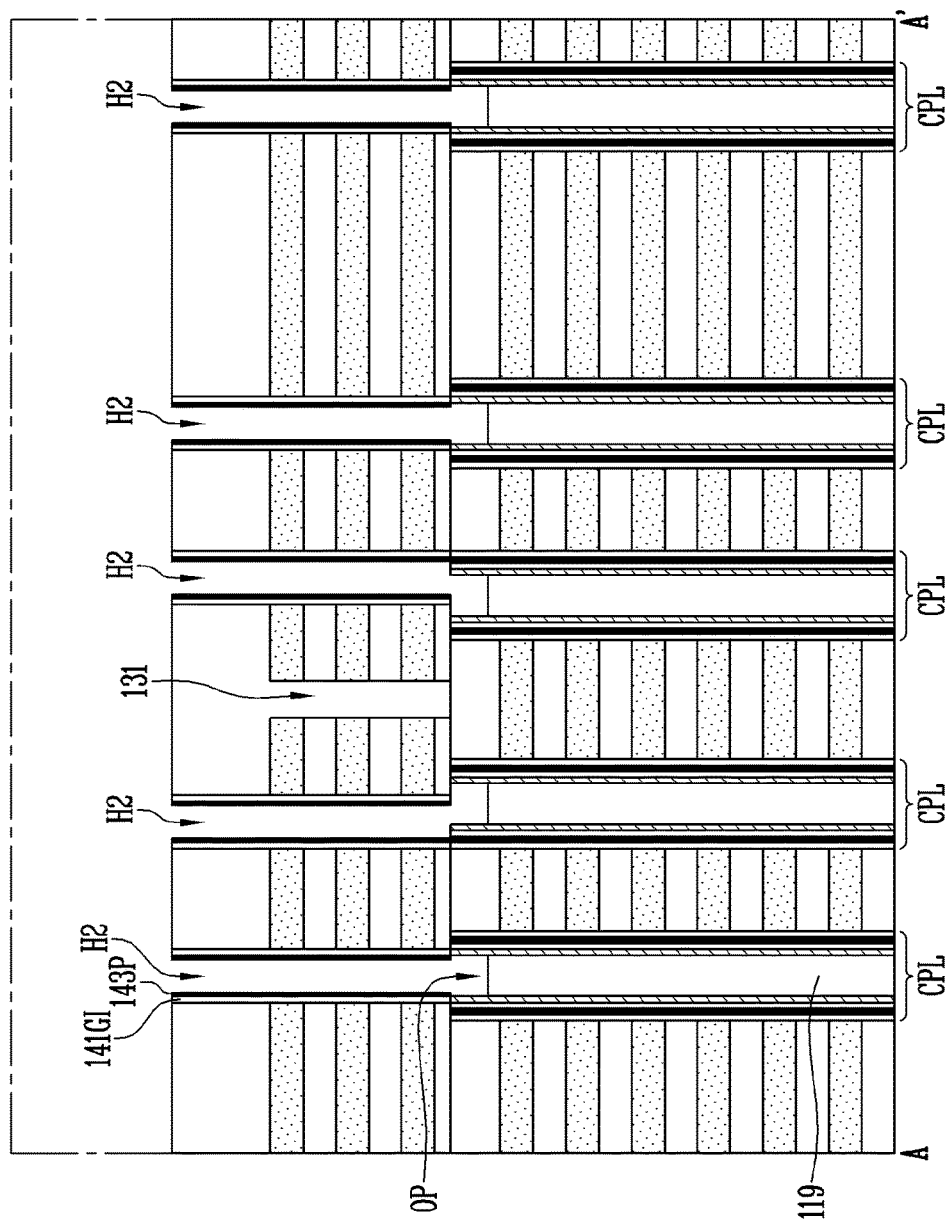

Referring to FIG. 7F, cell pillars CPL are exposed through bottom surfaces of the second holes H2 by etching the spacer layer (143 of FIG. 7E) and the liner insulating layer (141 of FIG. 7E) through an etch-back process. The etch-back process may be performed such that a portion of the liner insulating layer (141 of FIG. 7E) remains as a gate insulating layer 141GI on a sidewall of each of the second holes H2. The spacer layer (143 of FIG. 7E) may remain as a spacer pattern 143P to protect the gate insulating layer 141GI remaining on the sidewall of each of the second holes H2 from the etch-back process.

Subsequently, upper portions of the core insulating layers 119 of the cell pillars CPL are removed, to define openings OP under the second holes H2.

Referring to FIG. 7G, the space patterns (143P of FIG. 7F) are removed, and second channel layers CH2 are then filled in the second holes (H2 of FIG. 7F). The second channel layers CH2 extend to be filled in the openings (OP of FIG. 7F). The second channel layers CH2 may be formed of a semiconductor layer. For example, the second channel layers CH2 may be formed of a doped silicon layer.

The second channel layers CH2 may overlap with the first channel layers CH1, and contact the first channel layers CH1. Like the first channel layers CH1, the second channel layers CH2 may be divided into a first column a and a second column b, which are adjacent to each other, and a plurality of columns ma and mb. Second channel layers CH2 constituting the plurality of columns ma and mb may be divided into a first group ma and a second group mb, which are opposite to each other with the first and second columns a and b interposed therebetween.

A second channel layer CH2 in the first column a overlaps with the first channel layer CH1 in the first column a, and a second channel layer CH2 in the second column b overlaps with the first channel layer CH1 in the second column b. Second channel layers CH2 in the first group ma overlap with the first channel layers CH1 in the first group ma, and second channel layers CH2 in the second group mb overlap with the first channel layers CH1 in the second group mb. The second channel layers CH2 in the first and second columns a and b are disposed biased to one side of the first channel layers CH1 in the first and second columns a and b, respectively. More specifically, the second channel layer CH2 in the first column a, which overlaps with the first channel layer CH1 in the first column a, and the second channel layer CH2 in the second column b, which overlaps with the first channel layer CH1 in the second column b, overlap with the first channel layer CH1 in the first column a and the first channel layer CH1 in the second column b to be biased to one side of the first channel layer CH1 in the first column a and one side of the first channel layer CH1 in the second column b, which face in both the directions of the axis intersecting the first upper slit 131, respectively. In other words, the second channel layer CH2 in the first column a, which overlaps with the first channel layer CH1 in the first column a, is disposed biased to one side of the first channel layer CH1 in the first column a, which faces the first channel layer CH1 in the first group ma. The second channel layer CH2 in the second column b, which overlaps with the first channel layer CH1 in the second column b, is disposed biased to one side of the first channel layer CH1 in the second column b, which faces the first channel layer CH1 in the second group mb.

Referring to FIG. 7H, a slit mask pattern 151 is formed on the upper slit insulating layer 133. After forming the second channel layers CH2 in the first and second columns a and b (see FIG. 7G), slits 153 penetrating the sub-stack structures SUB and the first stack structure ST1 are formed through an etching process using the slit mask pattern 151 as an etch barrier.

Figure 7I:
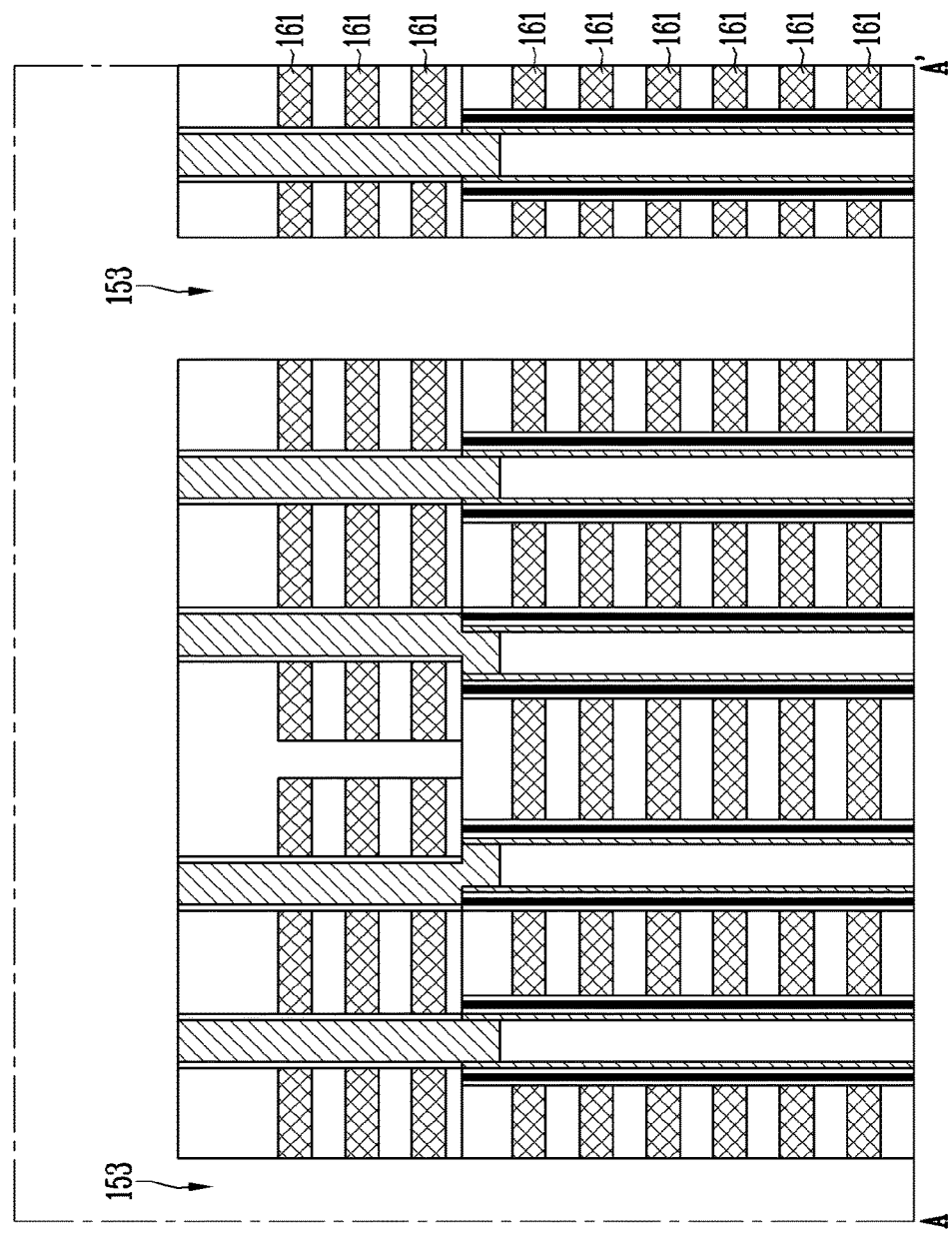

Referring to FIG. 7I, the second sacrificial layers of the sub-stack structures (SUB of FIG. 7H) and the first sacrificial layers of the first stack structure (STI of FIG. 7H) are replaced with conductive patterns 161 through the slits 153. To this end, a step of opening conductive regions by removing the first sacrificial layers and the second sacrificial layers through the slits 153, a step of filling a conductive layer in the conductive regions, and a step of removing the conductive layer inside the slits 153 such that the conductive layer remains in only the conductive regions may be sequentially performed. The conductive patterns 161 may include a low-resistance metal layer such as tungsten.

Subsequently, a process of filling slit insulating layers (not shown) in the slits 153, a process of forming bit lines, and the like may be sequentially performed.

Figure 8A:
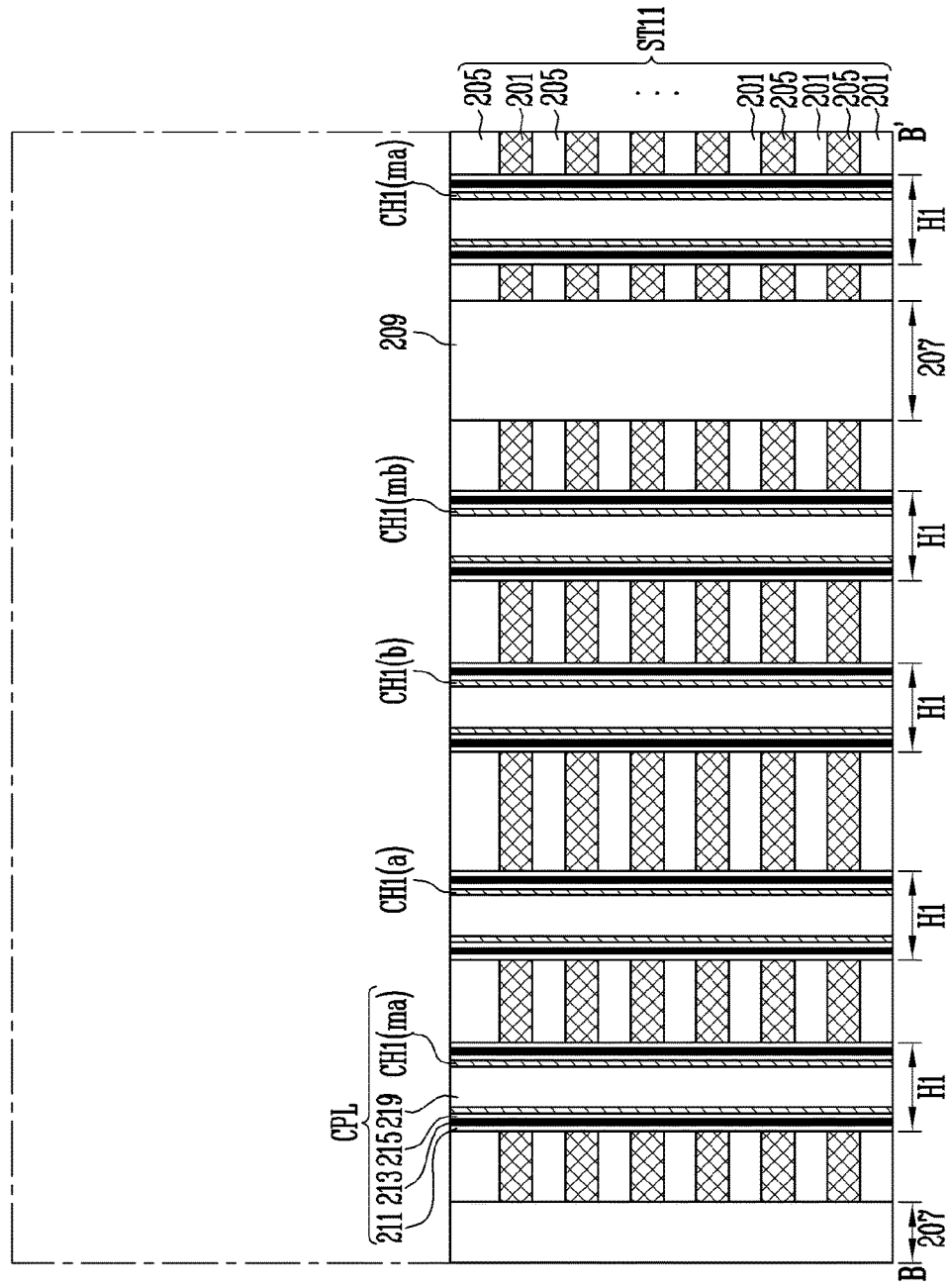
FIGS. 8A to 8C are sectional views illustrating a manufacturing method of a semiconductor device according to an embodiment of the present disclosure.
Figure 8B:
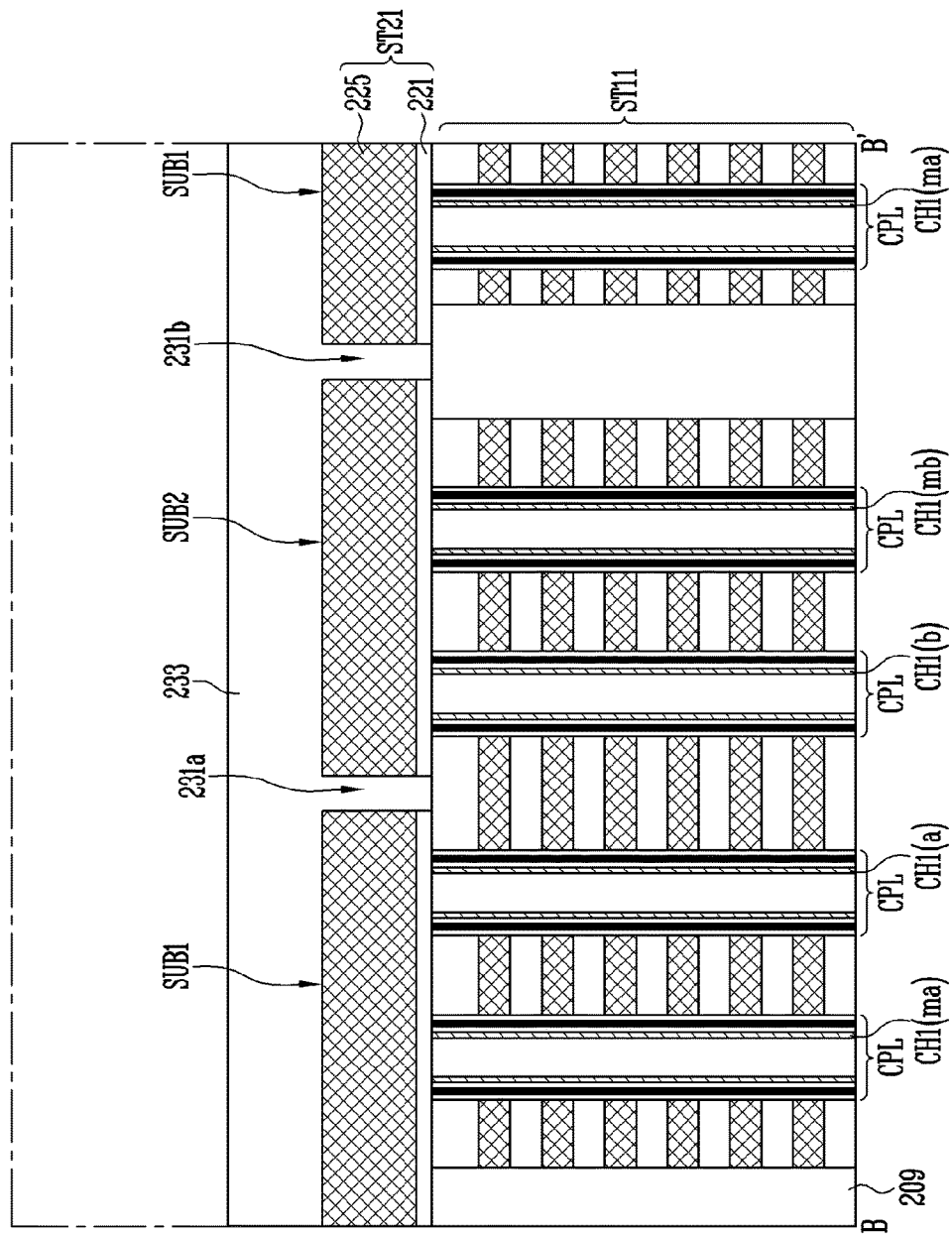
Figure 8C:
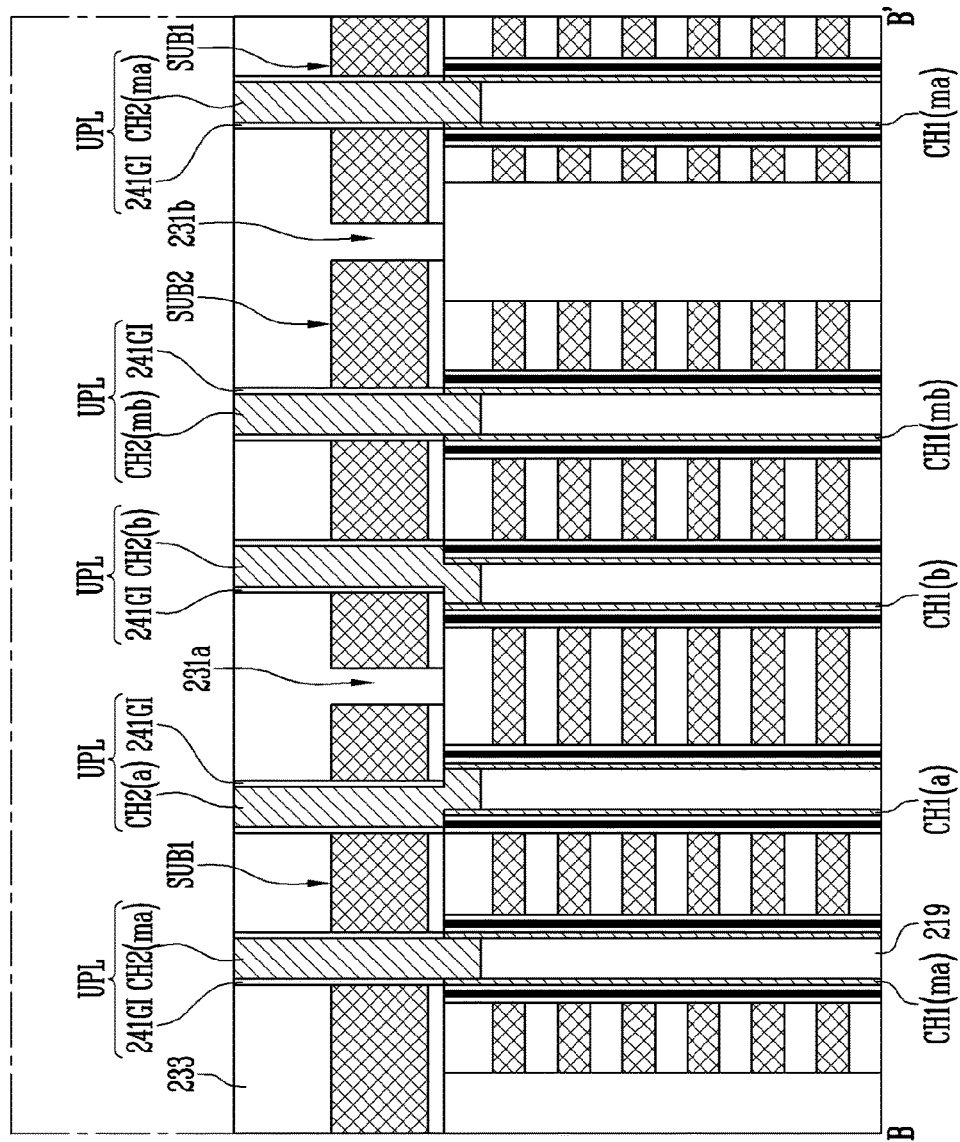

FIGS. 8A to 8C are sectional views illustrating a manufacturing method of a semiconductor device according to an embodiment of the present disclosure. More specifically, FIGS. 8A to 8C are sectional views illustrating a manufacturing method of the semiconductor device shown in FIGS. 6A and 6B.

Referring to FIG. 8A, a process of forming first channel layers CH1 penetrating the first stack structure ST11 is performed. The first stack structure ST11 may include material layers for gates of memory cells.

The process may include a step of forming the first stack structure ST11 by alternately stacking first interlayer insulating layers 201 and first conductive patterns 205, a step of forming first holes H1 penetrating the first stack structure ST11, and a step of forming cell pillars CPL filled in the first holes H1.

The first interlayer insulating layers 201 may be formed of an oxide layer, and the first conductive patterns 205 may be formed of a low-resistance metal layer such as tungsten. The first conductive patterns 205 may be formed of various conductive materials such as a polysilicon layer, in addition to the low-resistance metal layer.

The first holes H1 may be formed by etching the first interlayer insulating layers 201 and the first conductive patterns 205.

The cell pillars CPL may be formed using the same processes as described in FIG. 7A. Each of the cell pillars CPL may include a blocking insulating layer 211, a data storage layer 213, a tunnel insulating layer 215, a first channel layer CH1, and a core insulating layer 219.

The first channel layers CH1 inside the first holes H1 may be divided into a first column a and a second column b, which are adjacent to each other, and a plurality of columns ma and mb. First channel layers CH1 constituting the plurality of columns ma and mb may be divided into a first group ma and a second group mb, which are opposite to each other with the first and second columns a and b interposed therebetween. The first channel layer CH1 in the plurality of columns ma and mb may be simultaneously formed with the first channel layers CH1 of the first column a and the second column b.

Subsequently, slits 207 penetrating the first stack structure ST11 are formed. After that and before a second stack structure (ST21 of FIG. 8B) is formed, slit insulating layers 209 filled in the slits 207 are formed. The slit insulating layers 209 may divide the first stack structure ST11 into a plurality of cell stack structures by penetrating the first interlayer insulating layers 201 and the first conductive patterns 205.

Referring to FIG. 8B, the second stack structure ST21 is formed on the first stack structure ST11 to cover the cell pillars CPL, the slit insulating layers 209, and the first channel layers CH1 in the first column a, the second column b and the plurality of columns ma and mb. The second stack structure ST21 may include a material layer for a gate of a drain select transistor. For example, the second stack structure ST21 may include at least one set of a second interlayer insulating layer 221 and a second conductive pattern 225, which are sequentially stacked. FIG. 8B illustrates the second stack structure ST21 including one set of the second interlayer insulating layer 221 and the second conductive pattern 225. However, the present disclosure is not limited thereto. For example, the second stack structure ST21 may include two or more sets of the second interlayer insulating layer 221 and the second conductive pattern 225, which are sequentially stacked.

The second interlayer insulating layer 221 may be formed of an oxide layer, and the second conductive pattern 225 may be formed of a low-resistance metal layer such as tungsten. The second conductive pattern 225 may be formed of various conductive materials such as a polysilicon layer, in addition to the low-resistance metal layer.

After that, a first upper slit 231a and second upper slits 231b, which penetrate the second stack structure ST21 including the second interlayer insulating layer 221 and the second conductive pattern 225, are simultaneously formed. The first upper slit 231a and the second upper slits 231b may be formed in a wave shape as described in FIGS. 4B and 6A.

The first upper slit 231a penetrates the second stack structure ST21 along a boundary between the first and second columns a and b of the first channel layers CH1, and is disposed between the second upper slits 231b. The second upper slits 231b overlap with the slit insulating layers 209. The second stack structure ST21 may be divided into a first sub-stack structure SUB1 and a second sub-stack structure SUB2 by the first upper slit 231a and the second upper slits 231b.

The first sub-stack structure SUB1 covers the first channel layer CH1 in the first column a and the first channel layer CH1 in the first group ma, and the second sub-stack structure SUB2 covers the first channel layer CH1 in the second column b and the first channel layer CH1 in the second group mb.

After the first upper slit 231a and the second upper slits 231b are formed, an upper slit insulating layer 233 is formed. The upper slit insulating layer 233 may be formed to completely fill in the first upper slit 231a and the second upper slits 231b and to cover the first and second sub-stack structures SUB1 and SUB2.

Referring to FIG. 8C, upper pillars UPL are formed. The upper pillars UPL penetrate the upper slit insulating layer 233, and penetrate the first and second sub-stack structures SUB1 and SUB2. Each of the upper pillars UPL includes a second channel layer CH2 and a gate insulating layer 241GI surrounding a sidewall of each of the second channel layers CH2 in a first column a, a second column b and a plurality of columns ma and mb. The gate insulating layer 241GI and the second channel layer CH2 may be formed using the processes described in FIGS. 7D to 7G.

The second channel layers CH2 of the upper pillars UPL may extend to the inside of central regions of the first channel layers CH1. The second channel layers CH2 overlap with the first channel layers CH1, and contact the first channel layers CH1. Like the first channel layers CH1, the second channel layers CH2 may be divided into the first column a and the second column b, which are adjacent to each other and penetrate the sub-stack structures SUB1 and SUB2, and the plurality of columns ma and mb. Second channel layers CH2 constituting the plurality of columns ma and mb that penetrate the sub-stack structures SUB1 and SUB2 may be divided into a first group ma and a second group mb, which are opposite to each other with the first and second columns a and b interposed therebetween. The second channel layers CH2 in the plurality of columns ma and mb and the second channel layers CH2 in the first and second columns a and b may be simultaneously formed to contact the first channel layers CH1 in the first column a, the second column b and the plurality of columns ma and mb. The overlapping relationship between the second channel layers CH2 and the first channel layers CH1 is the same as described in FIG. 7G.

Subsequently, subsequent processes such as a process of forming bit lines may be performed.

Figure 9:
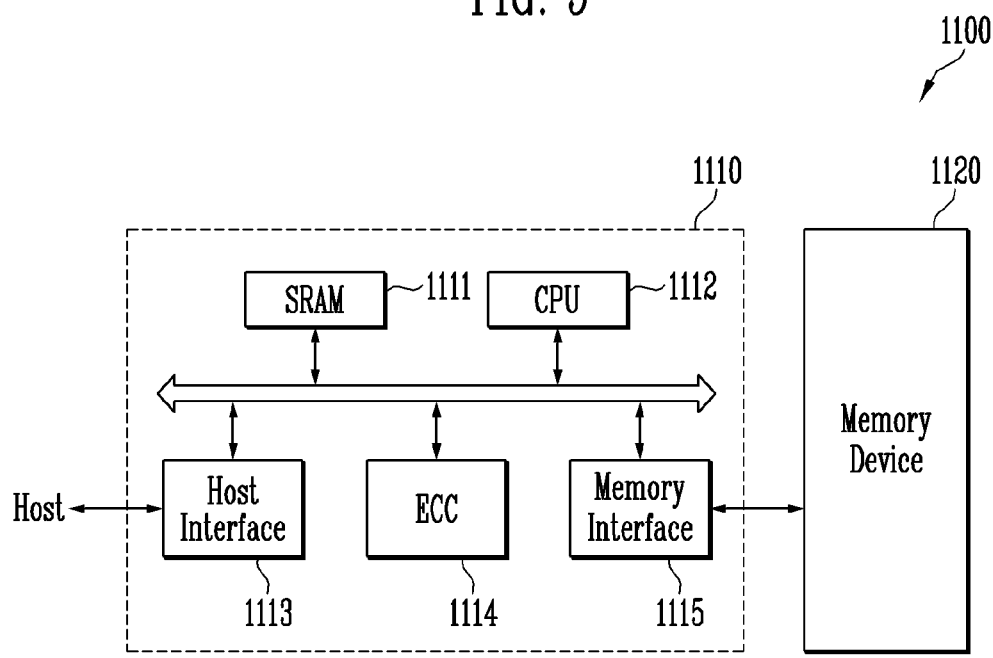
FIG. 9 is a block diagram illustrating a memory system according to an embodiment of the present disclosure.

FIG. 9 is a block diagram illustrating a memory system according to an embodiment of the present disclosure.

Referring to FIG. 9, the memory system 1100 according to an embodiment of the present disclosure includes a memory device 1120 and a memory controller 1110.

The memory device 1120 may include the structures described in FIGS. 2 to 6B. For example, the memory device 1120 includes first channel layers in two columns, which penetrate a cell stack structure, first and second upper stack structures isolated from each other by an upper slit which are disposed on the cell stack structure and formed along a boundary between the first channel layers in the two columns, and second channel layers in two columns, which overlap with the first channel layers in the two columns by penetrating the first and second upper stack structures. The first upper stack structure extends toward a first side from the upper slit, and the second upper stack structure extends toward a second side from the upper slit. The second channel layers penetrating the first upper stack structure are disposed biased to one side of the first channel layers, which face the first side, and the second channel layers penetrating the second upper stack structure are disposed biased to one side of the first channel layers, which face the second side.

The memory device 1120 may be formed using the processes described in FIGS. 7A to 7I or using the processes described in FIGS. 8A to 8C.

The memory device 1120 may be a multi-chip package formed of a plurality of flash memory chips.

The memory controller 1110 is configured to control the memory device 1120, and may include a static random access memory (SRAM) 1111, a central processing unit (CPU) 1112, a host interface 1113, an error correction code (ECC) block 1114, and a memory interface 1115. The SRAM 1111 may be used as an operation memory of the CPU 1112. The CPU 1112 may perform general control operations so that the memory controller 1110 may exchange data. The host interface 1113 may include a data exchange protocol for a host connected with the memory system 1100. Also, the ECC block 1114 may detect and correct errors included in a data read from the memory device 1120, and the memory interface 1115 may interface with the memory device 1120. In addition, the memory controller 1110 may further include a read only memory (ROM) for storing code data for interfacing with the host, and the like.

The memory system 1100 configured as described above may be a memory card or a solid state disk (SSD), in which the memory device 1120 is combined with the memory controller 1110. For example, when the memory system 1100 is an SSD, the memory controller 1100 may communicate with the outside (e.g., the host) through one among various interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, and an integrated drive electronics (IDE) protocol.

Figure 10:
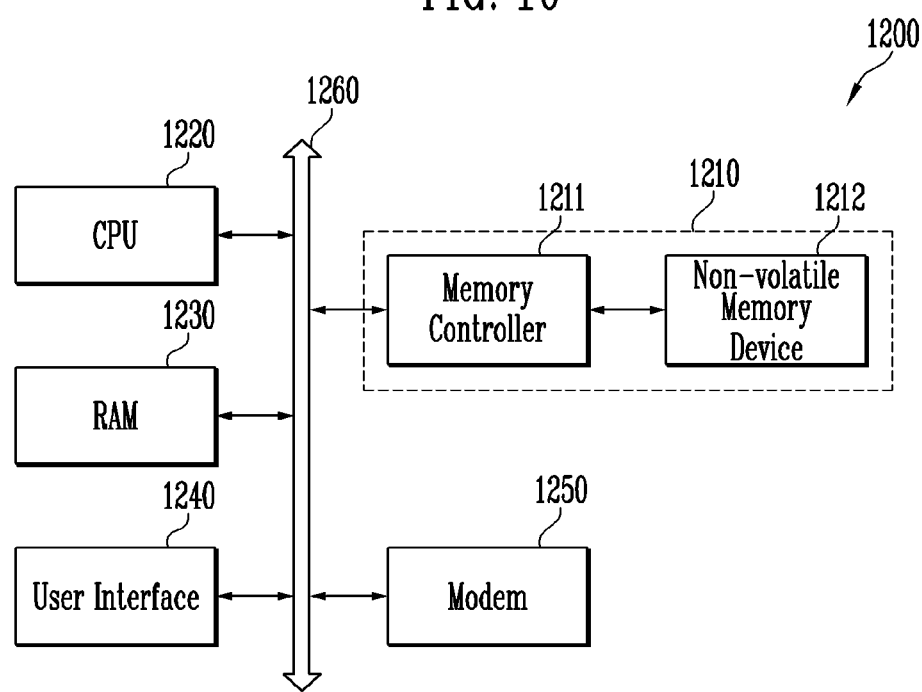
FIG. 10 is a block diagram illustrating a computing system including the memory system described with reference to FIG. 9.

FIG. 10 is a block diagram illustrating a computing system including the memory system described with reference to FIG. 9.

Referring to FIG. 10, the computing system 1200 according to an embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a camera image processor (CIS), a mobile D-RAM, and the like may be further included.

The memory system 1210, as described with reference to FIG. 9, may be configured with a memory device 1212 and a memory controller 1211.

According to an embodiment of the present disclosure, a second channel layer in a first column and a second channel layer in a second column are disposed biased to one side of a first channel layer in a first column and a first channel layer in a second column, which face directions opposite to each other, respectively. According to an embodiment of the present disclosure, although a space between the first channel layer in the first column and the first channel layer in the second column is not widened, a space in which an upper slit is to be disposed can be sufficiently widely secured between the channel layer in the first column and the second channel layer in the second column. As a result, embodiments of the present disclosure can improve the degree of integration of the semiconductor device.

Example embodiments have been disclosed herein, and although specific terms are employed, they are used and are to be interpreted in a generic and descriptive sense only and not for the purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
a cell stack structure extending along an extending direction of a first axis, the cell stack structure having a first sidewall and a second sidewall, which respectively face in both directions of a second axis intersecting the first axis;
first channel layers in a first column and a second column, which penetrate the cell stack structure;
first and second upper stack structures isolated from each other by a first upper slit extending along a boundary between the first channel layers in the first column and the first channel layers in the second column, the first and second upper stack structures being disposed on the cell stack structure;
second channel layers in a first column, penetrating the first upper stack structure, the second channel layers in the first column overlapping the first channel layers in the first column to be biased to one side of the first channel layers in the first column, which face the first sidewall; and
second channel layers in a second column, penetrating the second upper stack structure, the second channel layers in the second column overlapping the first channel layers in the second column to be biased to one side of the first channel layers in the second column, which face the second sidewall,
wherein each of distances between the second channel layers in the first column and the second channel layers in the second column is greater than each of distances between the first channel layers in the first column and the first channel layers in the second column.

2. The semiconductor device of claim 1, wherein the cell stack structure includes first interlayer insulating layers and first conductive patterns, which are alternately stacked.

3. The semiconductor device of claim 2, wherein the first conductive patterns are connected to gates of memory cells.

4. The semiconductor device of claim 1, further comprising:
first channel layers in a plurality of columns, penetrating the cell stack structure between the first channel layers in the first column and the first sidewall and between the first channel layers in the second column and the second sidewall.

5. The semiconductor device of claim 4, further comprising:
second channel layers in a plurality of columns, penetrating the first and second upper stack structures, the second channel layers in a plurality of columns, extending to contact the first channel layers in the plurality of columns.

6. The semiconductor device of claim 1, wherein each of the first and second upper stack structures includes one set of a second interlayer insulating layer and a second conductive pattern, which are sequentially stacked, or includes two or more sets of the second interlayer insulating layer and the second conductive pattern.

7. The semiconductor device of claim 6, wherein the second conductive pattern is connected to a gate of a drain select transistor.

8. The semiconductor device of claim 1, wherein the first upper slit is formed in a wave shape along the extending direction of the first axis.

9. The semiconductor device of claim 1, wherein the first upper stack structure includes a third sidewall protruding further than the first sidewall, and
the second upper stack structure includes a fourth sidewall protruding further than the second sidewall.

10. The semiconductor device of claim 9, wherein the third and fourth sidewalls are defined along sidewalls of second upper slits, which are opposite to each other with the first and second upper stack structures interposed between the second upper slits.

11. The semiconductor device of claim 10, wherein the second upper slits are formed in a wave shape along the extending direction of the first axis.

12. The semiconductor device of claim 1, further comprising:

a multi-layered liner layer surrounding each of the first channel layers in the first column and the first channel layers in the second column, the multi-layered liner layer including a tunnel insulating layer, a data storage layer, and a blocking insulating layer; and a gate insulating layer surrounding each of the second channel layers in the first column and the second channel layers in the second column.

13. A semiconductor device comprising:

first and second upper stack structures isolated from each other by an upper slit;

a cell stack structure extending to overlap with the first upper stack structure, the second upper stack structure and the upper slit, the cell stack structure disposed under the first upper stack structure, the second upper stack structure and the upper slit;

first channel layers penetrating the cell stack structure and adjacent to the upper slit; and second channel layers penetrating the first and second upper stack structures and overlapping the first channel layers; and wherein each of distances between the second channel layers and the upper slit is greater than each of distances between the first channel layers and the upper slit.

* * * * *